(12) United States Patent
Kojima et al.

(10) Patent No.: US 8,946,738 B2
(45) Date of Patent: Feb. 3, 2015

(54) LIGHT EMITTING DEVICE, LIGHT EMITTING MODULE, AND METHOD FOR MANUFACTURING LIGHT EMITTING DEVICE

(71) Applicant: Kabushiki Kaisha Toshiba, Minato-ku (JP)

(72) Inventors: Akihiro Kojima, Kanagawa-ken (JP); Yoshiaki Sugizaki, Kanagawa-ken (JP); Yosuke Akimoto, Kanagawa-ken (JP); Kazuhito Higuchi, Kanagawa-ken (JP); Susumu Obata, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/961,527

(22) Filed: Aug. 7, 2013

(65) Prior Publication Data

US 2013/0320381 A1    Dec. 5, 2013

Related U.S. Application Data

(63) Continuation of application No. PCT/JP2011/005125, filed on Sep. 12, 2011.

(30) Foreign Application Priority Data

Mar. 25, 2011   (JP) .................................. 2011-067906

(51) Int. Cl.
*H01L 33/00* (2010.01)
*H01L 29/20* (2006.01)
(Continued)

(52) U.S. Cl.
CPC .............. *H01L 33/62* (2013.01); *H01L 33/486* (2013.01); *H01L 33/0079* (2013.01); *H01L 33/20* (2013.01);
(Continued)

(58) Field of Classification Search
CPC ......... H01L 33/36; H01L 33/38; H01L 33/54; H01L 33/486; H01L 33/62; H01L 33/0079; H01L 33/44; H01L 33/20; H01L 33/0066; H05K 2201/10106; H05K 2201/10454
USPC ........... 257/98, 99, 79, 91; 438/26, 27, 29, 42
See application file for complete search history.

(56) References Cited

U.S. PATENT DOCUMENTS 7,619,306 B2    11/2009   Kaneko
7,847,306 B2    12/2010   Feng et al.
(Continued)

FOREIGN PATENT DOCUMENTS

EP    2197051       6/2010
JP    2000-244012   9/2000
(Continued)

OTHER PUBLICATIONS

International Search Report issued on Dec. 22, 2011 for PCT/JP2011/005125 filed on Sep. 12, 2011 with English Translation.
(Continued)

*Primary Examiner* — Colleen A Matthews
*Assistant Examiner* — Quovaunda V Jefferson
(74) *Attorney, Agent, or Firm* — Oblon, Spivak, McClelland, Maier & Neustadt, L.L.P.

(57) ABSTRACT

According to one embodiment, a light emitting device includes a semiconductor layer, a p-side electrode, an n-side electrode, a first insulating layer, a p-side interconnect layer, an n-side interconnect layer, and a second insulating layer. The portion of the second p-side interconnect layer has the L-shaped cross section being configured to include a p-side external terminal exposed from the first insulating layer and the second insulating layer at a third surface having a plane orientation different from the first surface and the second surface. The portion of the second n-side interconnect layer has the L-shaped cross section being configured to include an n-side external terminal exposed from the first insulating layer and the second insulating layer at the third surface.

20 Claims, 31 Drawing Sheets

(51) Int. Cl.
  *H01L 33/62* (2010.01)
  *H01L 33/48* (2010.01)
  *H01L 33/20* (2010.01)
  *H01L 33/44* (2010.01)
  *H01L 33/54* (2010.01)
  *H05K 1/18* (2006.01)

(52) U.S. Cl.
  CPC .............. *H01L 33/44* (2013.01); *H01L 33/54* (2013.01); *H01L 2933/0066* (2013.01); *H05K 1/181* (2013.01); *H05K 2201/10106* (2013.01); *H05K 2201/10454* (2013.01); *H01L 2924/0002* (2013.01)
  USPC .................. 257/91; 257/98; 257/99; 438/26; 438/27; 438/29; 438/42

(56) References Cited

U.S. PATENT DOCUMENTS

| | | | |
|---|---|---|---|
| 8,110,421 B2 | 2/2012 | Sugizaki et al. |
| 8,148,183 B2 | 4/2012 | Hamasaki et al. |
| 8,278,676 B2 | 10/2012 | Kojima et al. |
| 8,288,843 B2 | 10/2012 | Kojima et al. |
| 8,319,246 B2 | 11/2012 | Sugizaki et al. |
| 8,350,285 B2 | 1/2013 | Sugizaki et al. |
| 8,367,523 B2 | 2/2013 | Sugizaki et al. |
| 8,368,089 B2 | 2/2013 | Kojima et al. |
| 8,373,192 B2 | 2/2013 | Sugizaki et al. |
| 8,377,726 B2 | 2/2013 | Kojima et al. |
| 8,378,377 B2 | 2/2013 | Sugizaki et al. |
| 8,436,378 B2 | 5/2013 | Kojima et al. |
| 8,445,916 B2 | 5/2013 | Kojima et al. |
| 2008/0093607 A1 | 4/2008 | Feng et al. |
| 2008/0105981 A1 | 5/2008 | Kaneko |
| 2010/0140640 A1 | 6/2010 | Shimokawa et al. |
| 2010/0148198 A1* | 6/2010 | Sugizaki et al. ............ 257/98 |
| 2011/0204396 A1 | 8/2011 | Akimoto et al. |
| 2011/0220931 A1 | 9/2011 | Kojima et al. |
| 2011/0284909 A1 | 11/2011 | Sugizaki et al. |
| 2011/0284910 A1 | 11/2011 | Iduka et al. |
| 2011/0291148 A1 | 12/2011 | Sugizaki et al. |
| 2011/0297965 A1 | 12/2011 | Akimoto et al. |
| 2011/0297980 A1 | 12/2011 | Sugizaki et al. |
| 2011/0297995 A1 | 12/2011 | Akimoto et al. |
| 2011/0298001 A1 | 12/2011 | Akimoto et al. |
| 2011/0300651 A1 | 12/2011 | Kojima et al. |

FOREIGN PATENT DOCUMENTS

| | | |
|---|---|---|
| JP | 2002-118293 | 4/2002 |
| JP | 2010-141176 | 6/2010 |
| WO | 2008/114434 | 9/2008 |

OTHER PUBLICATIONS

International Written Opinion issued on Dec. 22, 2011 for PCT/JP2011/005125 filed on Sep. 12, 2011.

Combined Office Action and Search Report issued Feb. 25, 2014, in Taiwanese Patent Application No. 100133783 with English translation.

Office Action issued in Korean Patent Application No. 10-2013-7022512, (with English-language Translation).

* cited by examiner

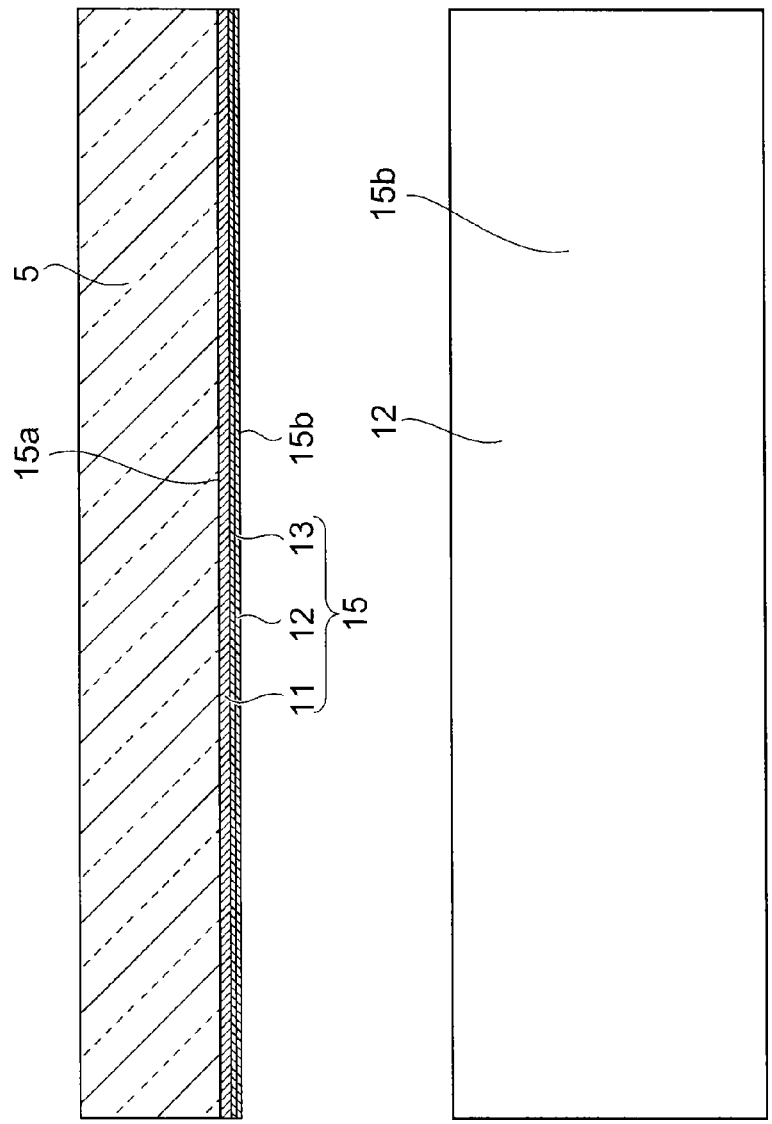

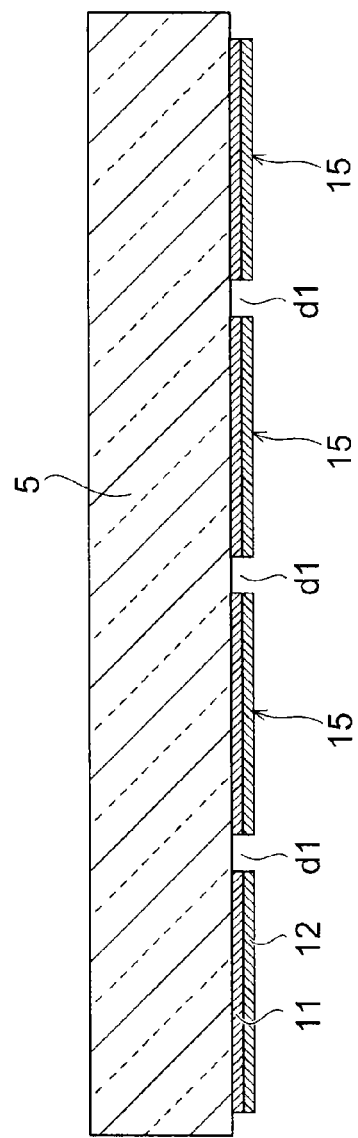
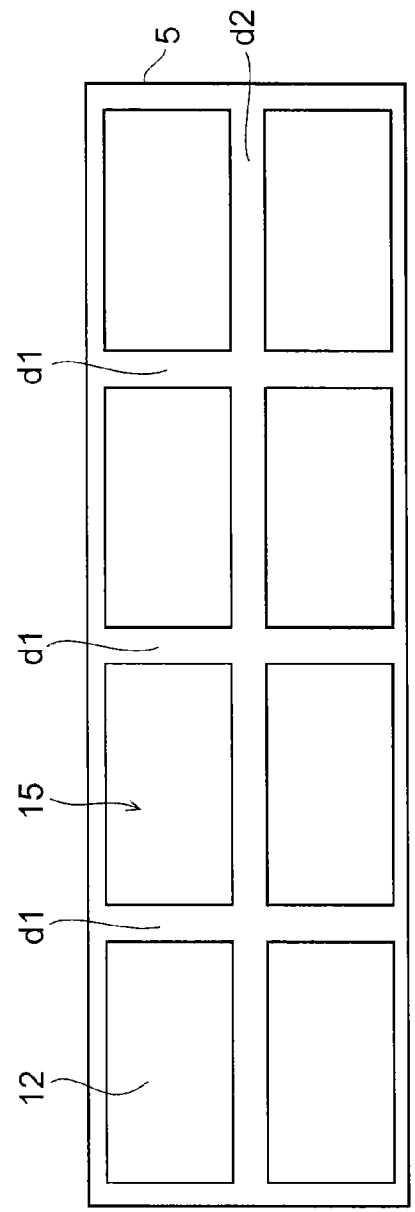
FIG. 4A
FIG. 4B

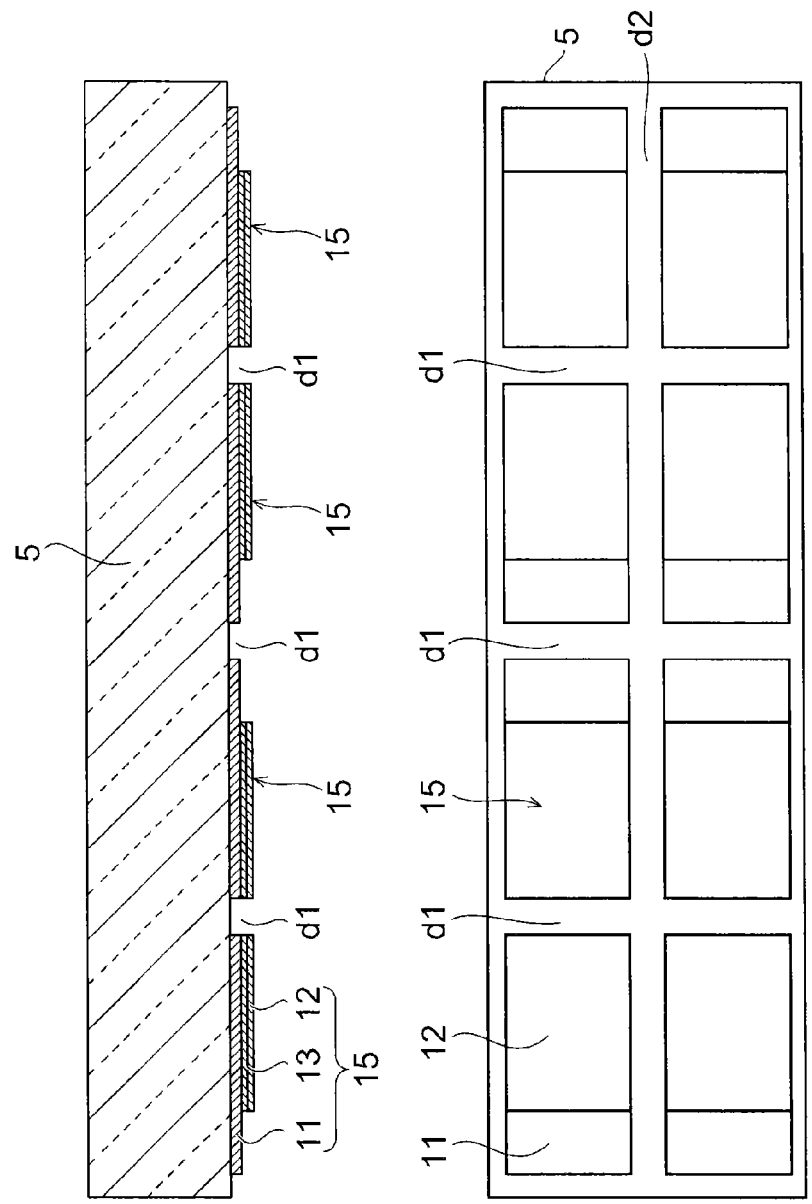

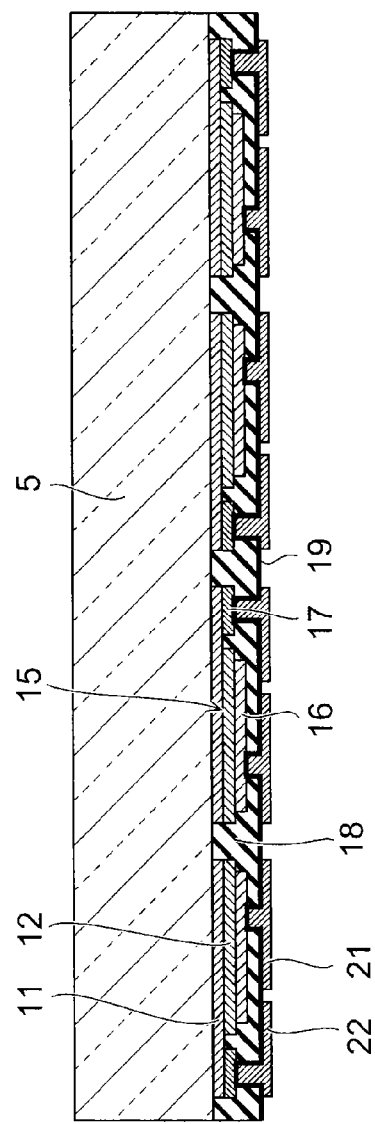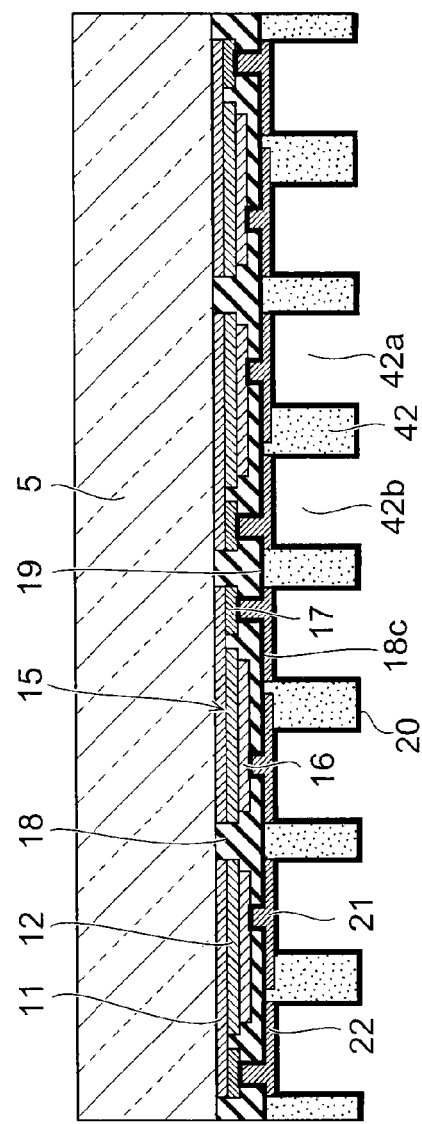
FIG. 9A
FIG. 9B

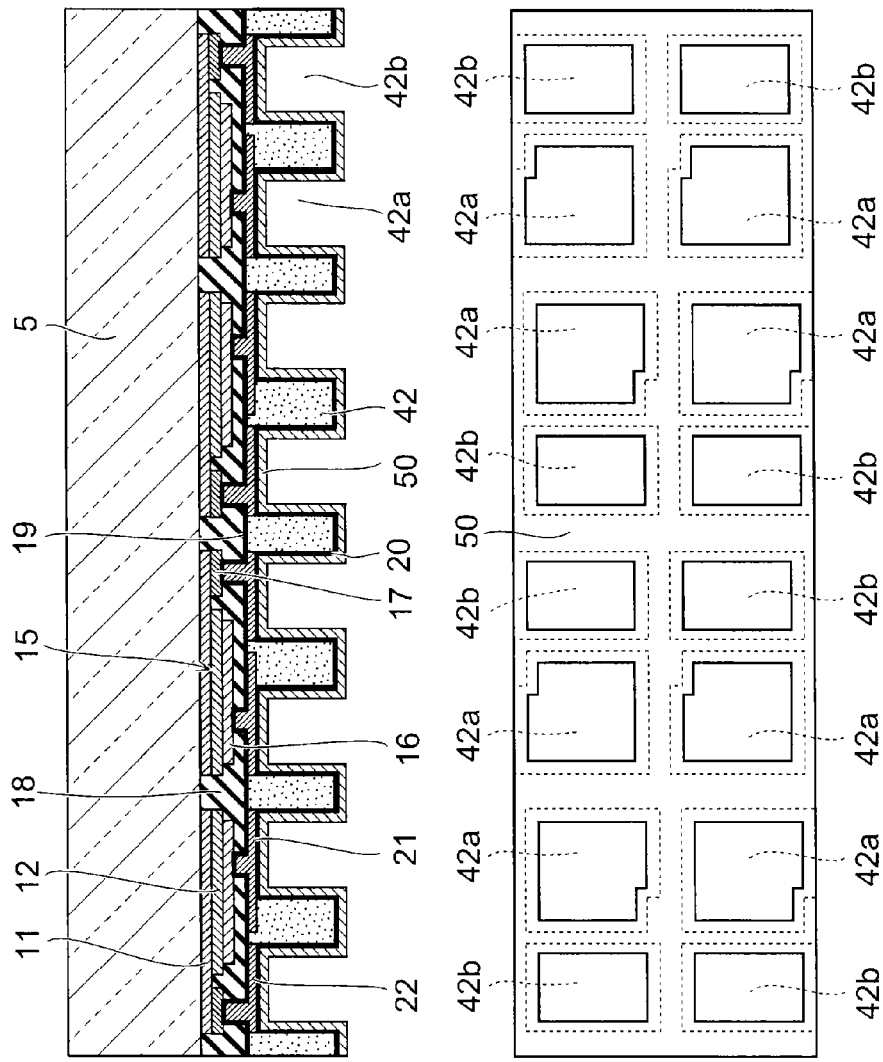

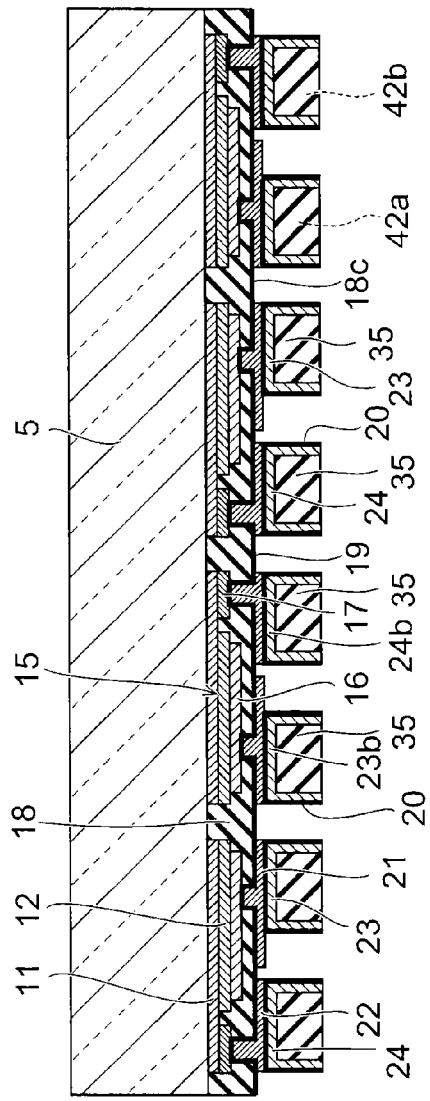
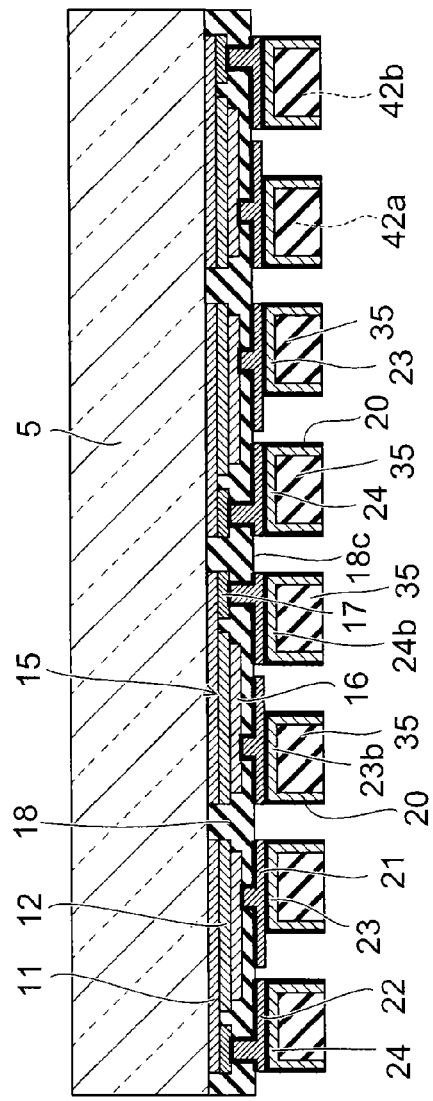
FIG. 13A
FIG. 13B

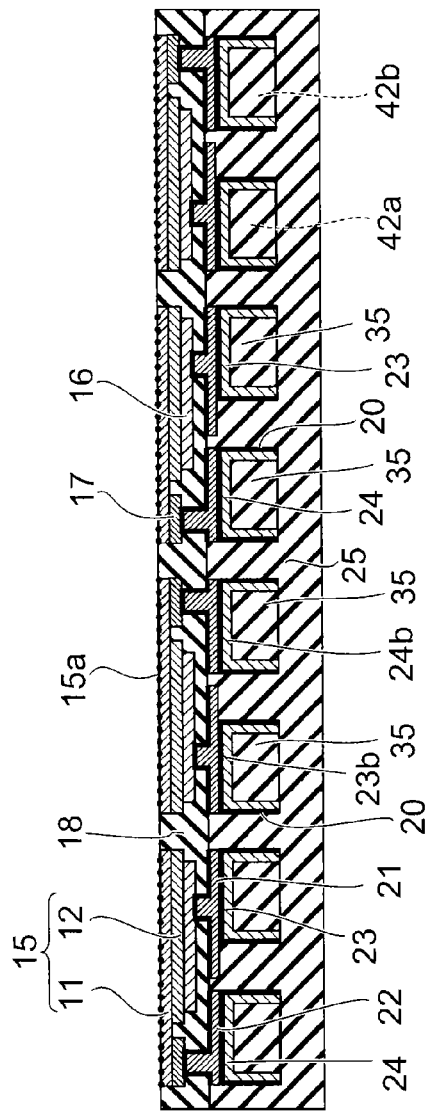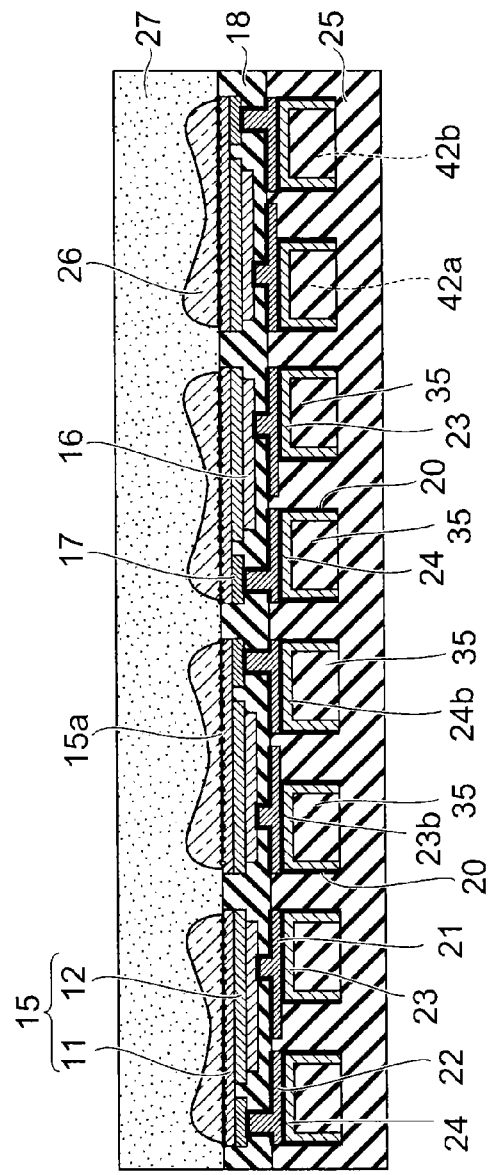
FIG. 15A
FIG. 15B

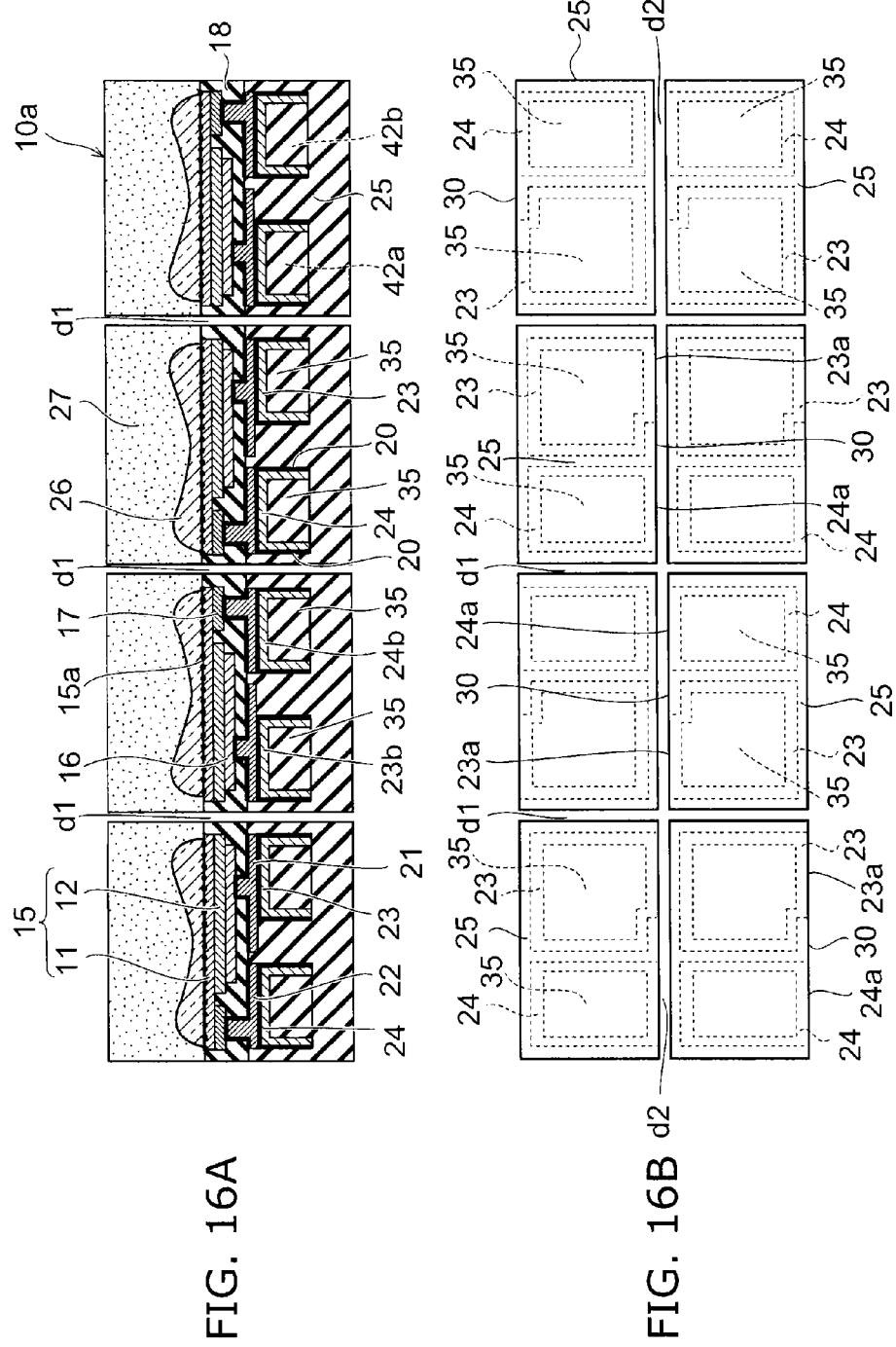

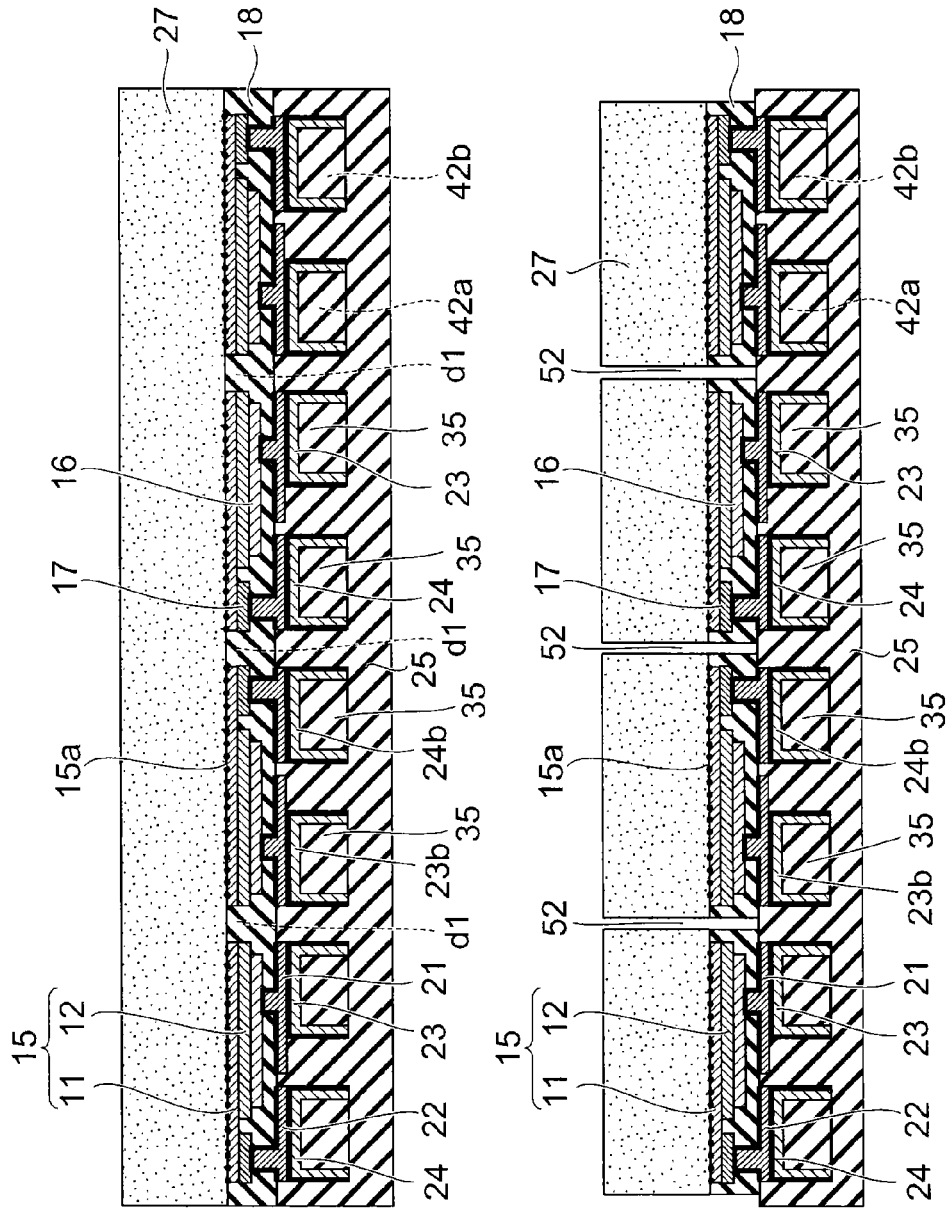

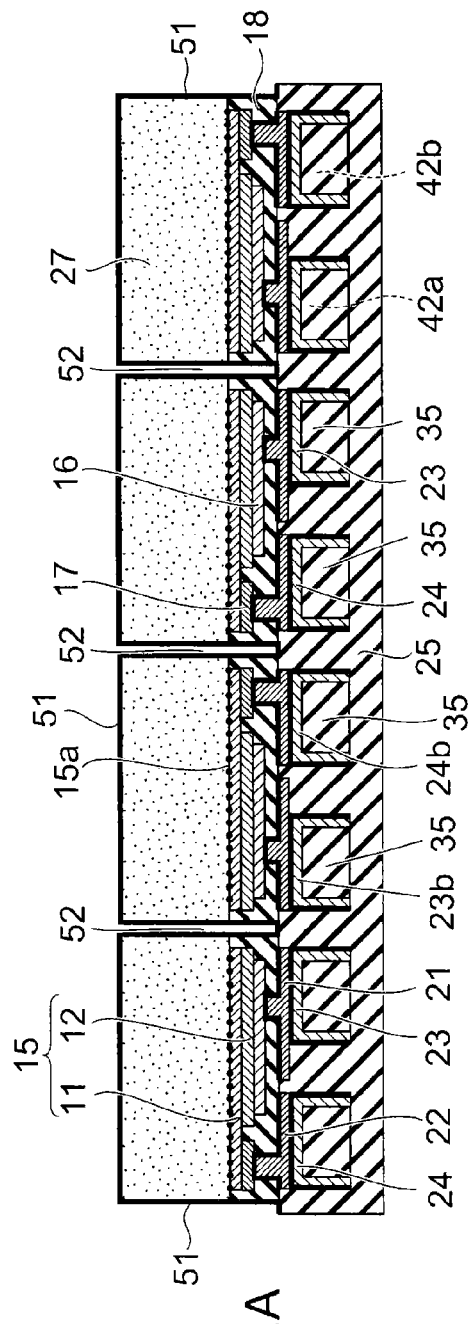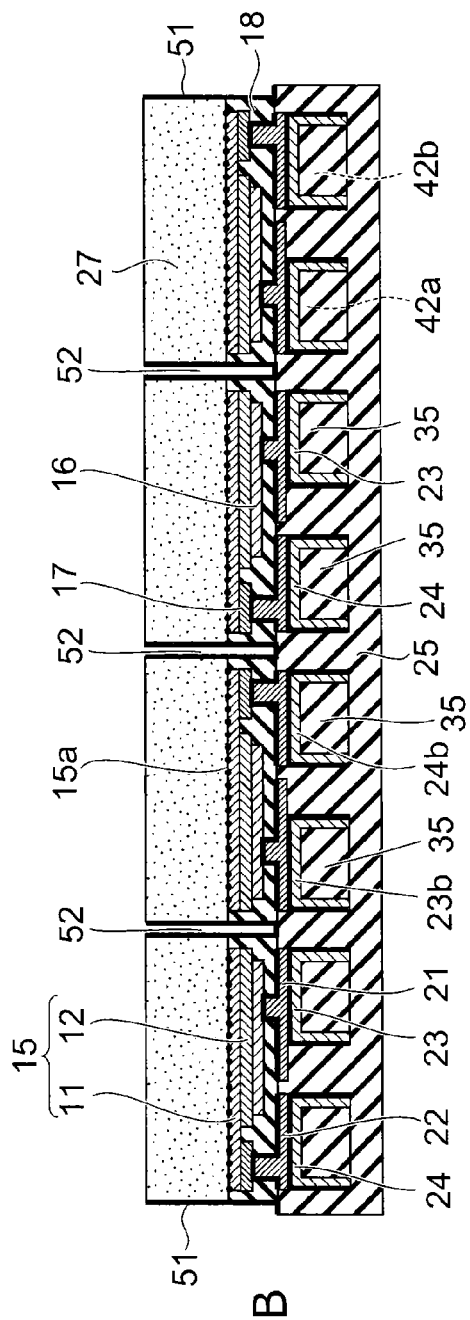
FIG. 22A
FIG. 22B

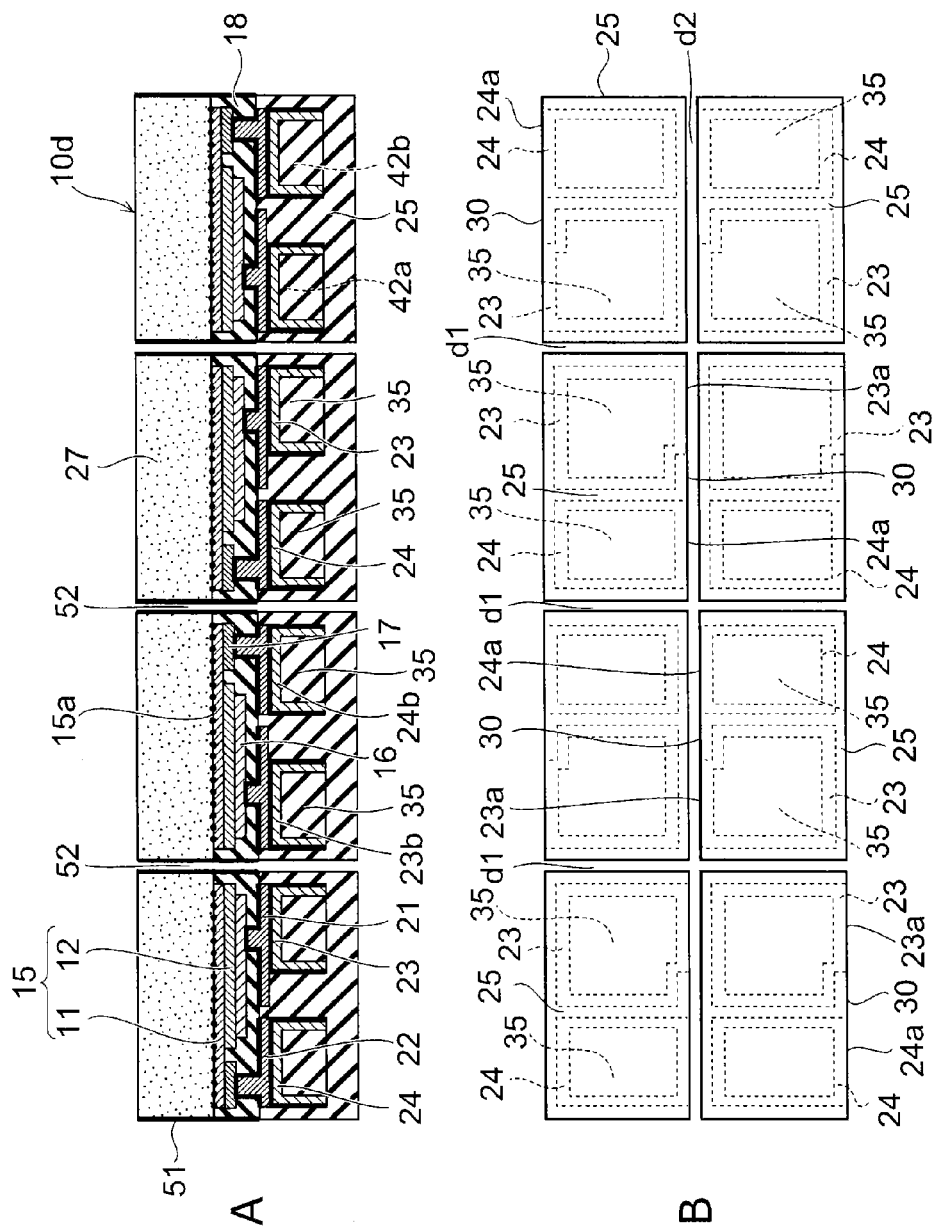

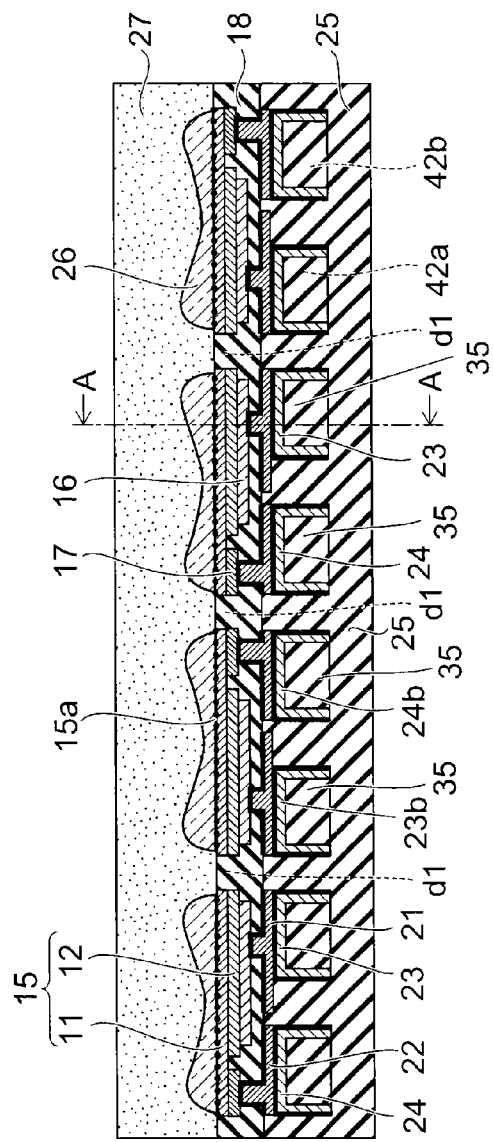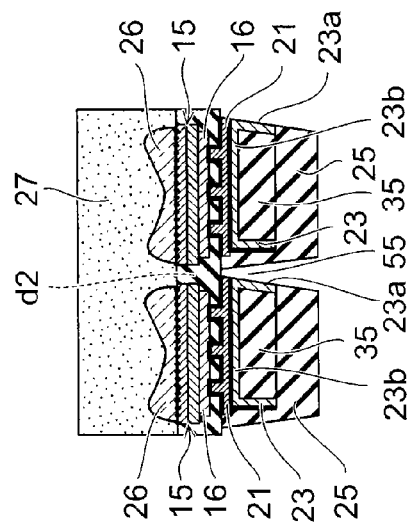
FIG. 28A
FIG. 28B

LIGHT EMITTING DEVICE, LIGHT EMITTING MODULE, AND METHOD FOR MANUFACTURING LIGHT EMITTING DEVICE

CROSS-REFERENCE TO RELATED APPLICATIONS

This is a continuation application of International Application PCT/JP2011/005125, filed on Sep. 12, 2011; the entire contents of which are incorporated herein by reference. This application also claims priority to Japanese Application No. 2011-067906, filed on Mar. 25, 2011. The entire contents of each are incorporated herein by reference.

FIELD

Embodiments described herein relate generally to a light emitting device, a light emitting module, and a method for manufacturing a light emitting device.

BACKGROUND

Applications of semiconductor light emitting devices capable of emitting visible light or white light are expanding to illumination apparatuses, backlight light sources of liquid crystal display apparatuses, display apparatuses, etc. The need to downsize in such applications is increasing more and more; and there is a need to further increase the suitability for mass production and decrease the price of the semiconductor light emitting devices.

BRIEF DESCRIPTION OF THE DRAWINGS

FIGS. 3A to 16B are schematic views illustrating a method for manufacturing the semiconductor light emitting device of the first embodiment;

FIGS. 21A to 23B are schematic views illustrating a method for manufacturing the semiconductor light emitting device of the second embodiment;

FIGS. 28A to 29B are schematic views illustrating a method for manufacturing the semiconductor light emitting device of the fourth embodiment;

DETAILED DESCRIPTION

Figure 1A:
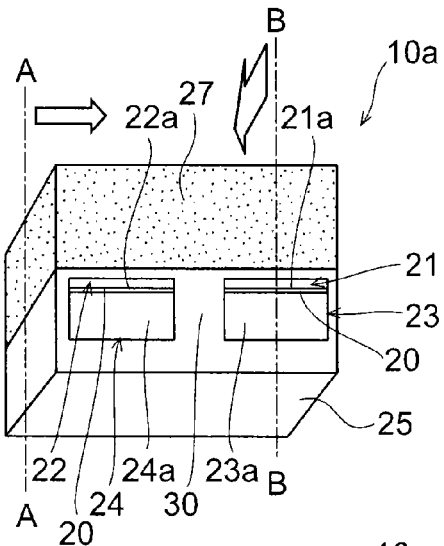
FIGS. 1A to 1C are schematic perspective views of a light emitting device of a first embodiment.

According to one embodiment, a light emitting device includes a semiconductor layer, a p-side electrode, an n-side electrode, a first insulating layer, a p-side interconnect layer, an n-side interconnect layer, and a second insulating layer. The semiconductor layer includes a first surface, a second surface opposite to the first surface, and a light emitting layer. The p-side electrode is provided on the second surface in a region including the light emitting layer. The n-side electrode is provided on the second surface in a region not including the light emitting layer. The first insulating layer is provided on the second surface side. The first insulating layer has a first via communicating with the p-side electrode and a second via communicating with the n-side electrode. The p-side interconnect layer includes a first p-side interconnect layer electrically connected to the p-side electrode through the first via, and a second p-side interconnect layer electrically connected to the first p-side interconnect layer and provided on an interconnect surface provided on a side of the first insulating layer opposite to the semiconductor layer. The second p-side interconnect layer includes a portion having an L-shaped cross section perpendicular to the first surface. The n-side interconnect layer includes a first n-side interconnect layer electrically connected to the n-side electrode through the second via, and a second n-side interconnect layer electrically connected to the first n-side interconnect layer, separated from the p-side interconnect layer and provided on the interconnect surface. The second n-side interconnect layer includes a portion having an L-shaped cross section perpendicular to the first surface. The second insulating layer is provided between the p-side interconnect layer and the n-side interconnect layer. The portion of the second p-side interconnect layer has the L-shaped cross section being configured to include a p-side external terminal exposed from the first insulating layer and the second insulating layer at a third surface having a plane orientation different from the first surface and the second surface. The portion of the second n-side interconnect layer has the L-shaped cross section being configured to include an n-side external terminal exposed from the first insulating layer and the second insulating layer at the third surface.

Embodiments will now be described with reference to the drawings.

Similar components in the drawings are marked with like reference numerals. A region of a portion of a wafer including multiple semiconductor layers 15 (chips) is illustrated in the drawings that illustrate manufacturing processes.

First Embodiment

Figure 1B:
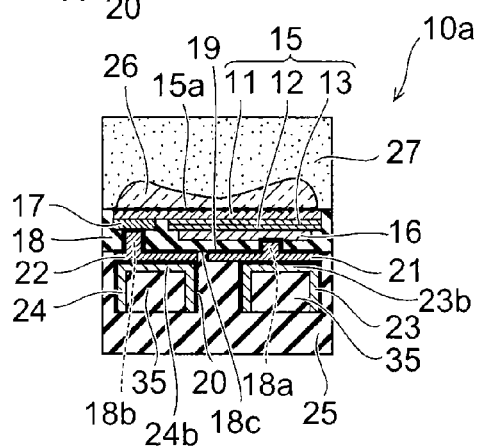
Figure 1C:
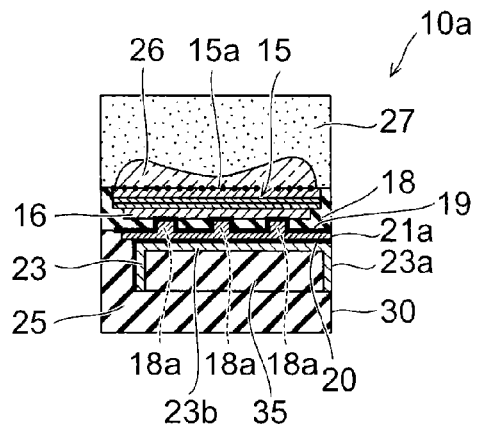

FIG. 1A is a schematic perspective view of a light emitting device 10a of a first embodiment. FIG. 1B is an A-A cross-sectional view of FIG. 1A. FIG. 1C is a B-B cross-sectional view of FIG. 1A.

The light emitting device 10a includes the semiconductor layer 15. The semiconductor layer 15 includes a first surface 15a and a second surface formed on the side opposite to the first surface 15a. Electrodes and interconnect layers described below are provided on the second surface side; and light is emitted to the outside mainly from the first surface 15a opposite to the second surface.

The semiconductor layer 15 includes a first semiconductor layer 11 and a second semiconductor layer 12. The first semiconductor layer 11 and the second semiconductor layer 12 include, for example, a nitride semiconductor. The first semiconductor layer 11 includes, for example, a foundation buffer layer, an n-type layer, etc.; and the n-type layer functions as a lateral-direction path of current. The second semiconductor layer 12 includes a stacked structure in which a light emitting layer (an active layer) 13 is interposed between an n-type layer and a p-type layer.

The second surface side of the semiconductor layer 15 is patterned into an uneven configuration. The protruding portion formed on the second surface side includes the light emitting layer 13. A p-side electrode 16 is provided on the top surface of the second semiconductor layer 12, i.e., the top surface of the protruding portion. The p-side electrode 16 is provided in the region including the light emitting layer 13.

A region without the second semiconductor layer 12 is provided beside the protruding portion on the second surface side of the semiconductor layer 15; and an n-side electrode 17 is provided on the top surface of the first semiconductor layer 11 of the region. In other words, an n-side electrode 17 is provided in the region not including the light emitting layer 13.

On the second surface side of the semiconductor layer 15 as illustrated in FIG. 5B, the surface area of the second semiconductor layer 12 including the light emitting layer 13 is greater than the surface area of the first semiconductor layer 11 not including the light emitting layer 13.

Figure 6A:
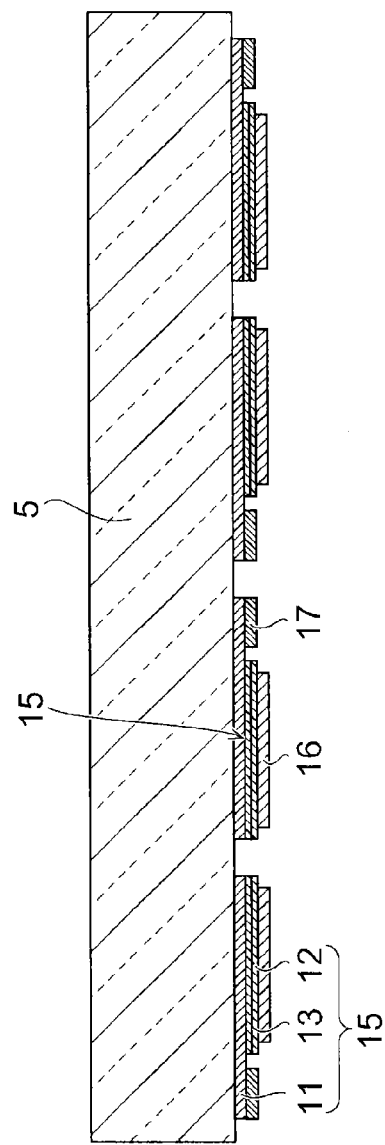
Figure 6B:
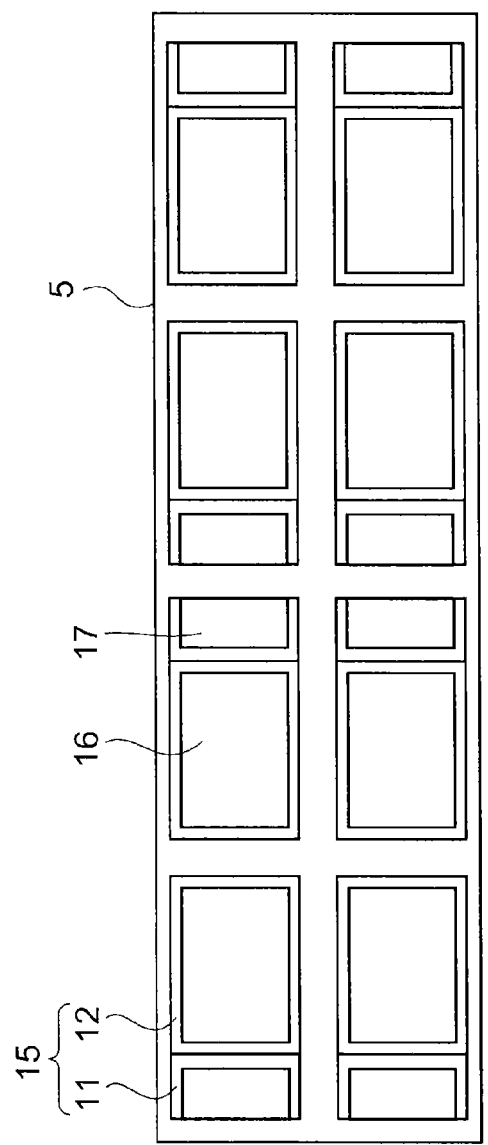

In one of the semiconductor layers 15 as illustrated in FIG. 6B, the p-side electrode 16 provided in the region including the light emitting layer 13 has a surface area greater than that of the n-side electrode 17 not including the light emitting layer 13. Thereby, a wide light emitting region is obtained. The layout of the p-side electrode 16 and the n-side electrode 17 illustrated in FIG. 6B is an example and is not limited to the layout.

A first insulating layer (hereinbelow called simply the insulating layer) 18 is provided on the second surface side of the semiconductor layer 15. The insulating layer 18 covers the semiconductor layer 15, the p-side electrode 16, and the n-side electrode 17. There are cases where another insulating film (e.g., a silicon oxide film) is provided between the insulating layer 18 and the semiconductor layer 15. The insulating layer 18 is, for example, a resin such as polyimide having excellent patternability of ultra-fine openings. Alternatively, an inorganic substance such as silicon oxide, silicon nitride, etc., may be used as the insulating layer 18.

The insulating layer 18 includes an interconnect surface 18c on the side opposite to the semiconductor layer 15. A first p-side interconnect layer (an inner p-side interconnect layer) 21 and a first n-side interconnect layer (an inner n-side interconnect layer) 22 are provided apart from each other on the interconnect surface 18c.

The first p-side interconnect layer 21 is provided also inside a first via 18a made in the insulating layer 18 to reach the p-side electrode 16 and is electrically connected to the p-side electrode 16. It is not always necessary for the first p-side interconnect layer 21 to be formed on the lower surface of the insulating layer 18. For example, a structure may be used in which the first p-side interconnect layer 21 is provided only on the p-side electrode 16 and the first p-side interconnect layer 21 is not provided outside the first via 18a of the insulating layer 18.

The first n-side interconnect layer 22 is provided also inside a second via 18b made in the insulating layer 18 to reach the n-side electrode 17 and is electrically connected to the n-side electrode 17.

A second p-side interconnect layer 23 is provided on the surface of the first p-side interconnect layer 21 on the side opposite to the p-side electrode 16. The first p-side interconnect layer 21 and the second p-side interconnect layer 23 are included in the p-side interconnect layer of the embodiment.

The p-side interconnect layer includes a portion provided in a configuration along the interconnect surface 18c of the insulating layer 18 and a portion provided in a configuration along a third surface 30 of the plane orientation different from the first surface 15a and the second surface. The cross section of the p-side interconnect layer from the portion provided along the interconnect surface 18c to the portion provided along the third surface 30 is formed in, for example, an L-shaped configuration as illustrated in FIG. 1C. The cross section illustrated in FIG. 1C is perpendicular to the first surface 15a, the second surface and the third surface 30.

The first p-side interconnect layer 21 is provided along the interconnect surface 18c on the interconnect surface 18c. The second p-side interconnect layer 23 includes a p-side connection unit 23b and a p-side external terminal 23a.

The p-side connection unit 23b is provided along the interconnect surface 18c on the first p-side interconnect layer 21. As illustrated in FIG. 1C, the portion having the L-shaped cross section is formed of the p-side connection unit 23b and the p-side external terminal 23a. In other words, the second p-side interconnect layer 23 has a portion having an L-shaped cross section; and a portion thereof (the p-side external terminal 23a) is used to form an external terminal.

The second p-side interconnect layer 23 is formed in a recessed configuration having the p-side connection unit 23b as a bottom. The p-side external terminal 23a is included in a portion of the side wall of the recessed configuration (the U-shaped configuration). That is, as illustrated in FIG. 1C, the cross-sectional configuration of the second p-side interconnect layer 23 is a U-shaped configuration; and a portion of the U-shaped configuration is an L-shaped configuration.

The cross-sectional configuration of the second p-side interconnect layer 23 is a U-shaped configuration at the cross section of the surface that intersects the interconnect surface 18c and is perpendicular to the third surface 30 such as that illustrated in FIG. 1C. Also, as illustrated in FIG. 1B, the cross section of the second p-side interconnect layer 23 has a U-shaped configuration at the cross section of the surface parallel to the third surface 30. As described below, the cross-sectional configuration of the second p-side interconnect layer 23 has a U-shaped configuration in the cross-sectional view illustrated in FIGS. 1B and 1C because the second p-side interconnect layer 23 has a cup-like configuration.

A second n-side interconnect layer 24 is provided on the surface of the first n-side interconnect layer 22 on the side opposite to the n-side electrode 17. The first n-side interconnect layer 22 and the second n-side interconnect layer 24 are included in the n-side interconnect layer of the embodiment.

The n-side interconnect layer includes a portion provided in a configuration along the interconnect surface 18c of the insulating layer 18 and a portion provided in a configuration along the third surface 30 of a plane orientation different from the first surface 15a and the second surface. The n-side interconnect layer from the portion provided along the interconnect surface 18c to the portion provided along the third surface 30 is formed in, for example, an L-shaped configuration.

The first n-side interconnect layer 22 is provided along the interconnect surface 18c on the interconnect surface 18c. The second n-side interconnect layer 24 includes an n-side connection unit 24b and an n-side external terminal 24a.

The n-side connection unit 24b is provided along the interconnect surface 18c on the first n-side interconnect layer 22. A portion having an L-shaped cross section is formed of the n-side connection unit 24b and the n-side external terminal 24a in the cross-sectional view parallel to the cross section illustrated in FIG. 1C. In other words, the second n-side interconnect layer 24 includes a portion having an L-shaped cross section; and a portion thereof (the n-side external terminal 24a) is used to form an external terminal.

The second n-side interconnect layer 24 is formed in a recessed configuration having the n-side connection unit 24b as a bottom. The n-side external terminal 24a is included in a portion of the side wall of the recessed configuration (the U-shaped configuration). That is, the cross section configuration of the second n-side interconnect layer 24 has a U-shaped configuration; and a portion of the U-shaped configuration is an L-shaped configuration.

The cross-sectional configuration of the second n-side interconnect layer 24 has a U-shaped configuration at a cross-sectional view parallel to the cross-sectional view illustrated in FIG. 1C which is the cross-sectional view of a surface that intersects the interconnect surface 18c and is perpendicular to the third surface 30. Also, as illustrated in FIG. 1B, the cross section of the second n-side interconnect layer 24 has a U-shaped configuration at the cross-sectional view of a surface parallel to the third surface 30. As described below, the cross-sectional configuration of the second n-side interconnect layer 24 has a U-shaped configuration in cross-sectional views at cross sections parallel to the cross-sectional view illustrated in FIG. 1B and the cross-sectional view illustrated in FIG. 1C because the second n-side interconnect layer 24 has a cup-like configuration.

A resin layer 25 is provided as a second insulating layer on the interconnect surface 18c of the insulating layer 18. The resin layer 25 covers the first p-side interconnect layer 21 and the first n-side interconnect layer 22. However, as illustrated in FIG. 1A, a side surface 21a of a portion of the first p-side interconnect layer 21 and a side surface 22a of a portion of the first n-side interconnect layer 22 are exposed from the resin layer 25 and the insulating layer 18 without being covered with the resin layer 25 and the insulating layer 18.

The resin layer 25 is filled between the second p-side interconnect layer 23 and the second n-side interconnect layer 24. The side walls of the second p-side interconnect layer 23 other than the p-side external terminal 23a are covered with the resin layer 25. The side walls of the second n-side interconnect layer 24 other than the n-side external terminal 24a are covered with the resin layer 25.

The end portion of the second p-side interconnect layer 23 on the side opposite to the first p-side interconnect layer 21 also is covered with the resin layer 25. Similarly, the end portion of the second n-side interconnect layer 24 on the side opposite to the first n-side interconnect layer 22 also is covered with the resin layer 25.

A resin layer 35 is filled as a third insulating layer inside the recessed configuration (the U-shaped configuration) of the second p-side interconnect layer 23 and similarly inside the recessed configuration (the U-shaped configuration) of the second n-side interconnect layer 24.

The end portion of the resin layer 35 on the side opposite to the first p-side interconnect layer 21 is covered with the resin layer 25. Accordingly, the second p-side interconnect layer 23 and the resin layer 25 are provided around the resin layer 35 provided inside the second p-side interconnect layer 23. Similarly, the second n-side interconnect layer 24 and the resin layer 25 are provided around the resin layer 35 provided inside the second n-side interconnect layer 24. The second p-side interconnect layer 23 and the second n-side interconnect layer 24 are covered with the resin layer 25 and the resin layer 35.

Figure 2:
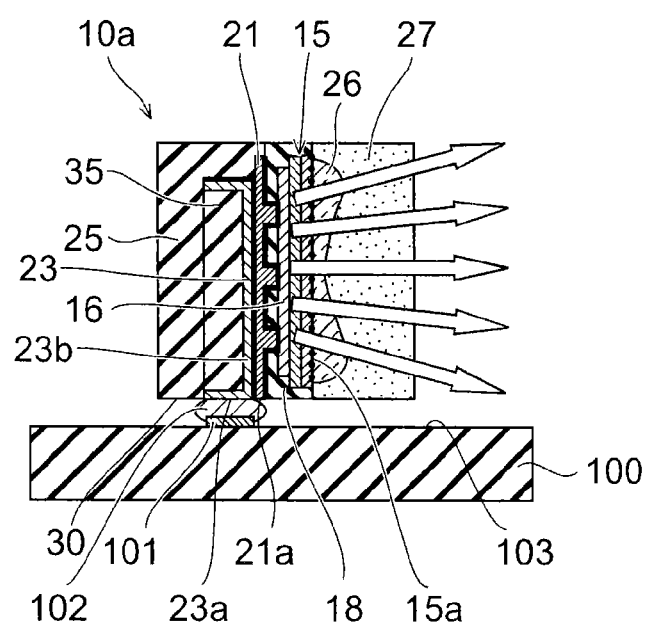
FIG. 2 is a schematic cross-sectional view of a light emitting module of the first embodiment.

The light emitting device 10a illustrated in FIGS. 1A to 1C is mounted such that the third surface 30 is the mounting surface (the surface opposing the mounting substrate) as illustrated in FIG. 2. In such a case, the p-side external terminal 23a, the exposed surface 21a of the first p-side interconnect layer 21, and a metal film 20 between the p-side external terminal 23a and the surface 21a are used as the external terminal of the p side.

The film thickness of the metal film 20 is about several nanometers; and the surface area of the metal film 20 exposed at the third surface 30 is smaller than that of the exposed surface 21a of the first p-side interconnect layer 21. The height-direction thickness of the exposed surface 21a of the first p-side interconnect layer 21 in FIGS. 1B and 1C is smaller than that of the p-side external terminal 23a. Therefore, the surface area of the exposed surface 21a of the first p-side interconnect layer 21 exposed at the third surface 30 is smaller than that of the p-side external terminal 23a.

Similarly for the n side, the metal film 20, the exposed surface 22a of the first n-side interconnect layer 22, and the n-side external terminal 24a have surface areas exposed at the third surface 30 that increase in this order.

As illustrated in FIGS. 1A and 1C, the side surface of a portion of the second p-side interconnect layer 23 is exposed from the insulating layer 18 and the resin layer 25 at the third surface 30 of the plane orientation different from the first surface 15a and the second surface of the semiconductor layer 15. This exposed surface functions as the p-side external terminal 23a for mounting to an external mounting substrate. The p-side external terminal 23a is formed to spread along the third surface 30 from one end portion of the p-side connection unit 23b.

Herein, the third surface 30 is a surface substantially perpendicular to the first surface 15a and the second surface. The resin layer 25 has four side surfaces having, for example, rectangular configurations; and one of the side surfaces having a relatively long side is used as the third surface 30.

The side surface of a portion of the second n-side interconnect layer 24 is exposed from the insulating layer 18 and the resin layer 25 at the same third surface 30. The exposed surface functions as the n-side external terminal 24a for mounting to the external mounting substrate. The n-side external terminal 24a is formed to spread along the third surface 30 from one end portion of the n-side connection unit 24b.

As illustrated in FIG. 1A, the side surface 21a of a portion of the first p-side interconnect layer 21 functions as the p-side external terminal by being exposed from the insulating layer 18 and the resin layer 25 at the third surface 30. Similarly, the side surface 22a of a portion of the first n-side interconnect layer 22 functions as the n-side external terminal by being exposed from the insulating layer 18 and the resin layer 25 at the third surface 30.

For the p-side interconnect layer, which includes the first p-side interconnect layer 21 and the second p-side interconnect layer 23, the portions other than the portions 21a and 23a exposed at the third surface 30 are covered with the insulating layer 18 or the resin layer 25. For the n-side interconnect layer, which includes the first n-side interconnect layer 22 and the second n-side interconnect layer 24, the portions other than the portions 22a and 24a exposed at the third surface 30 are covered with the insulating layer 18 or the resin layer 25.

The structure of the embodiment is an example; and the p-side interconnect layer and the n-side interconnect layer may be partially exposed elsewhere than the third surface 30.

Figures 8A, 8B:
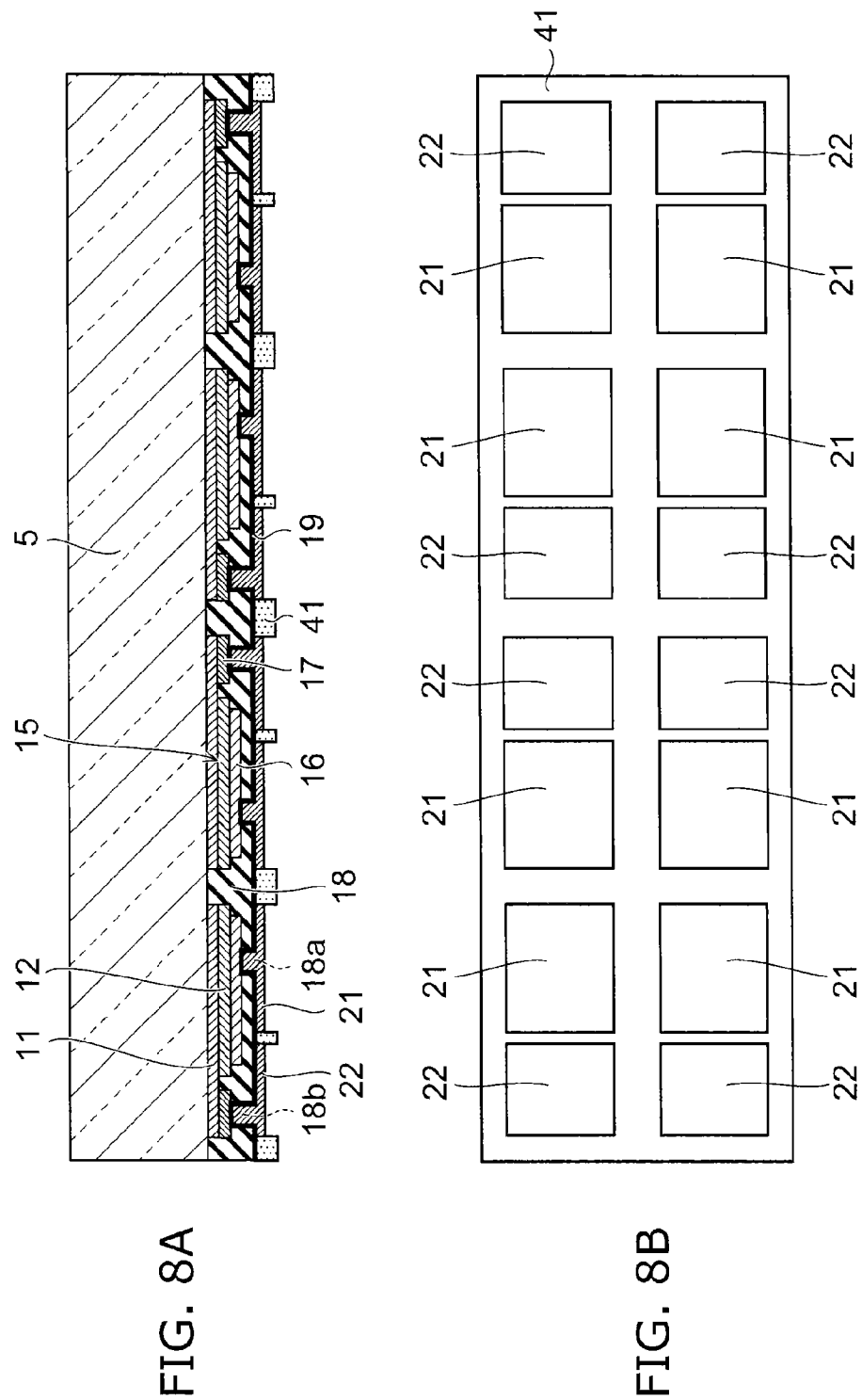

As illustrated in FIG. 8B, the distance between the side surface 21a of the first p-side interconnect layer 21 exposed at the third surface 30 and the side surface 22a of the first n-side interconnect layer 22 exposed at the third surface 30 are greater than the distance between the first p-side interconnect layer 21 and the first n-side interconnect layer 22 on the interconnect surface 18c of the insulating layer 18.

The surface area of the first p-side interconnect layer 21 can be increased by reducing the distance on the interconnect surface 18c of the insulating layer 18 between the first p-side interconnect layer 21 and the first n-side interconnect layer 22 covered with the resin layer 25. The planar size of the first p-side interconnect layer 21 is larger than the planar size of the p-side connection unit 23b of the second p-side interconnect layer 23. The first p-side interconnect layer 21 can be formed using a low-resistance metal such as, for example, copper. Therefore, it is possible to supply current with a more uniform distribution to the second semiconductor layer 12 including the light emitting layer 13 as the surface area of the first p-side interconnect layer 21 is increased. Further, the thermal conductivity of the first p-side interconnect layer 21 also can be increased; and it is possible to efficiently release the heat generated at the second semiconductor layer 12.

The p-side electrode 16 spreads in a region including the light emitting layer 13. Accordingly, by connecting the first p-side interconnect layer 21 to the p-side electrode 16 through a plurality of the first vias 18a, the current distribution to the light emitting layer 13 can be improved; and the heat dissipation of the heat generated at the light emitting layer 13 also can be improved.

The side surface 21a of the first p-side interconnect layer 21 exposed at the third surface 30 is separated from the side surface 22a of the first n-side interconnect layer 22 exposed at the third surface 30 by a distance such that the side surface 21a and the side surface 22a are not shorted to each other by a bonding agent such as solder when mounting to the mounting substrate.

A contact area between the first n-side interconnect layer 22 and the n-side connection unit 24b of the second n-side interconnect layer 24 is greater than a contact area between the first n-side interconnect layer 22 and the n-side electrode 17. A portion of the first n-side interconnect layer 22 extends over the interconnect surface 18c of the insulating layer 18 to an overlaying position under the light emitting layer 13.

Thereby, a wider lead electrode can be formed from the n-side electrode 17 provided in a narrow region not including the light emitting layer 13 via the first n-side interconnect layer 22 while obtaining a high light output due to the light emitting layer 13 being formed over a wide region.

A contact area between the first p-side interconnect layer 21 and the p-side connection unit 23b of the second p-side interconnect layer 23 may be greater than or less than a contact area between the first p-side interconnect layer 21 and the p-side electrode 16.

The first semiconductor layer 11 is electrically connected to the second n-side interconnect layer 24 including the n-side external terminal 24a via the n-side electrode 17 and the first n-side interconnect layer 22. The second semiconductor layer 12 including the light emitting layer 13 is electrically connected to the second p-side interconnect layer 23 including the p-side external terminal 23a via the p-side electrode 16 and the first p-side interconnect layer 21.

The resin layer 25 is thicker than the thickness (the height) of the p-side interconnect structure portion including the first p-side interconnect layer 21, the second p-side interconnect layer 23, and the resin layer 35 provided inside the second p-side interconnect layer 23. Similarly, the resin layer 25 is thicker than the thickness (the height) of the n-side interconnect structure portion including the first n-side interconnect layer 22, the second n-side interconnect layer 24, and the resin layer 35 provided inside the second n-side interconnect layer 24. The p-side interconnect structure portion and the n-side interconnect structure portion are thicker than the semiconductor layer 15. Therefore, the mechanical strength of the light emitting device 10a can be increased by the p-side interconnect structure portion, the n-side interconnect structure portion, and the resin layer 25 even without a substrate supporting the semiconductor layer 15.

The materials of the first p-side interconnect layer 21, the first n-side interconnect layer 22, the second p-side interconnect layer 23, and the second n-side interconnect layer 24 may include copper, gold, nickel, silver, etc. Of these, good thermal conductivity, high migration resistance, and excellent adhesion with insulating materials are obtained when copper is used.

The resin layer 25 reinforces the p-side interconnect structure portion and the n-side interconnect structure portion described above. It is notable for the resin layer 25 to have a coefficient of thermal expansion near to or the same as that of the mounting substrate. Examples of such a resin layer 25 include, for example, an epoxy resin, a silicone resin, a fluorocarbon resin, etc. Also, it is notable for the resin layer 35 to have a coefficient of thermal expansion near to or the same as that of the mounting substrate; and the same material as that of the resin layer 25 can be used.

A lens 26 and a phosphor layer 27 are provided on the first surface 15a of the semiconductor layer 15 as a transparent body transparent to the light emitted from the light emitting layer 13. The lens 26 is provided on the first surface 15a; and the phosphor layer 27 is provided to cover the lens 26.

The planar size of the stacked body including each of the components described above provided on the second surface side of the semiconductor layer 15 is substantially the same as the planar size of the phosphor layer 27. The lens 26 and the phosphor layer 27 do not obstruct the mounting onto a mounting substrate 100 of the light emitting device 10a illustrated in FIG. 2 because the lens 26 and the phosphor layer 27 do not jut into the third surface 30 side.

The phosphor layer 27 includes a transparent resin and a phosphor dispersed in the transparent resin. The phosphor layer 27 is capable of absorbing the light emitted from the light emitting layer 13 and emitting wavelength-converted light. Therefore, the light emitting device 10a is capable of emitting a mixed light of the light from the light emitting layer 13 and the wavelength-converted light of the phosphor layer 27.

For example, white, lamp, etc., can be obtained as the mixed color of a blue light from the light emitting layer 13 and a yellow light which is the wavelength-converted light of the phosphor layer 27 in the case where the light emitting layer 13 is a nitride semiconductor and the phosphor is a yellow phosphor configured to emit yellow light. The phosphor layer 27 may have a configuration including multiple types of phosphors (e.g., a red phosphor configured to emit red light and a green phosphor configured to emit green light).

The light emitted from the light emitting layer 13 is emitted to the outside mainly by traveling through the first semiconductor layer 11, the first surface 15a, the lens 26, and the phosphor layer 27. The lens 26 may be provided on the phosphor layer 27.

FIG. 2 is a schematic cross-sectional view of the light emitting module having a configuration in which the light emitting device 10a described above is mounted on the mounting substrate 100.

The number of the light emitting devices 10a mounted on the mounting substrate 100 is arbitrary and may be single or multiple. Multiple light emitting devices 10a may be included in a line-shaped light source by being arranged along some one direction.

The light emitting device 10a is mounted with an orientation in which the third surface 30 faces a mounting surface 103 of the mounting substrate 100. The p-side external terminal 23a and the n-side external terminal 24a exposed at the third surface 30 are bonded respectively to pads 101 formed in the mounting surface 103 via solder 102. An interconnect pattern also is formed in the mounting surface 103 of the mounting substrate 100; and the pads 101 are connected to the interconnect pattern. Other metals or electrically conductive materials other than solder may be used instead of the solder 102.

The third surface 30 is substantially perpendicular to the first surface 15a which is the main emitting surface of the light. Accordingly, the first surface 15a is configured to face the lateral direction instead of upward from the mounting surface 103 when the third surface 30 faces downward toward the mounting surface 103 side. In other words, a so-called side-view type light emitting device 10a and light emitting module are obtained in which the light is emitted in the lateral direction in the case where the mounting surface 103 is taken to be a horizontal surface.

In the embodiment, the stress applied to the semiconductor layer 15 via the solder 102 in the state in which the light emitting device 10a is mounted to the mounting substrate 100 can be relieved by being absorbed by the resin layer 35 filled inside the second p-side interconnect layer 23 and inside the second n-side interconnect layer 24. The resin layer 35 is more flexible than metal; and a high stress relieving effect is obtained.

The substance inside the second p-side interconnect layer 23 and inside the second n-side interconnect layer 24 is not limited to a resin; and an insulator or a metal of a material different from the second p-side interconnect layer 23 and the second n-side interconnect layer 24 may be filled. It is sufficient for the material filled inside the second p-side interconnect layer 23 and inside the second n-side interconnect layer 24 to be more flexible than the second p-side interconnect layer 23 the second n-side interconnect layer 24.

The stress relieving effect described above is obtained if, for example, a metal more flexible than the second p-side interconnect layer 23 and the second n-side interconnect layer 24 is selected as the material filled inside the second p-side interconnect layer 23 and inside the second n-side interconnect layer 24. It is also possible to select a metal film easily formed into a conformal film as the second p-side interconnect layer 23 and the second n-side interconnect layer 24 and to form an easily-fillable metal instead of the resin layer 35.

From the aspects of stress relief, productivity, and cost, it is notable for the resin to be filled inside the second p-side interconnect layer 23 and inside the second n-side interconnect layer 24.

The planar configuration of the light emitting device 10a of the embodiment is a rectangular configuration as viewed from a direction perpendicular to the first surface 15a; and the third surface 30 is a surface including the long side of the rectangular configuration.

A method for manufacturing the light emitting device 10a of the embodiment will now be described with reference to FIG. 3A to FIG. 16B. A region of a portion of the wafer state is illustrated in the drawings that illustrate processes.

FIG. 3A illustrates a stacked body in which the first semiconductor layer 11 and the second semiconductor layer 12 are formed on a major surface of a substrate 5. FIG. 3B corresponds to the bottom view of FIG. 3A.

The first semiconductor layer 11 is formed on the major surface of the substrate 5; and the second semiconductor layer 12 including the light emitting layer 13 is formed on the first semiconductor layer 11. In the case where the first semiconductor layer 11 and the second semiconductor layer 12 are, for example, nitride semiconductors, crystal growth of the first semiconductor layer 11 and the second semiconductor layer 12 can be performed by, for example, metal organic chemical vapor deposition (MOCVD) on a sapphire substrate.

For example, the first semiconductor layer 11 includes a foundation buffer layer and an n-type GaN layer. The second semiconductor layer 12 includes the light emitting layer (the active layer) 13 and a p-type GaN layer. The light emitting layer 13 may include a substance configured to emit blue, violet, bluish-violet, and ultraviolet light, etc.

The surface of the first semiconductor layer 11 contacting the substrate 5 is the first surface 15a of the semiconductor layer 15; and the top surface of the second semiconductor layer 12 is a second surface 15b of the semiconductor layer 15.

Then, as illustrated in FIG. 4A and FIG. 4B which is the bottom view thereof, a trench is made in dicing regions d1 and d2 to reach the substrate 5 by piercing the semiconductor layer 15 by, for example, Reactive Ion Etching (RIE) using a not-illustrated resist. The dicing regions d1 and d2 are formed in, for example, a lattice configuration on the substrate 5 of the wafer state. The trench made in the dicing regions d1 and d2 also is made in a lattice configuration to separate the semiconductor layer 15 into multiple chips.

The process of multiply separating the semiconductor layer 15 may be performed after the selective removal of the second semiconductor layer 12 or after the formation of the electrodes described below.

Then, as illustrated in FIG. 5A and FIG. 5B which is the bottom view thereof, a portion of the first semiconductor layer 11 is exposed by removing a portion of the second semiconductor layer 12 by, for example, RIE using a not-illustrated resist. The region where the first semiconductor layer 11 is exposed does not include the light emitting layer 13.

In the case where one subdivided semiconductor layer 15 made of the first semiconductor layer 11, the second semiconductor layer 12, and the light emitting layer (the active layer) 13 is used as one light emitting element, each of the four light emitting elements subdivided by the dicing region d1 in the lateral direction in FIG. 5B is subdivided by the dicing region d2 to be arranged as two light emitting elements in the vertical direction.

Then, as illustrated in FIG. 6A and FIG. 6B which is the bottom view thereof, the p-side electrode 16 and the n-side electrode 17 are formed on the second surface. The p-side electrode 16 is formed on the top surface of the second semiconductor layer 12. The n-side electrode 17 is formed on the exposed surface of the first semiconductor layer 11.

The p-side electrode 16 and the n-side electrode 17 are formed using, for example, sputtering, vapor deposition, etc. Either one of the p-side electrode 16 and the n-side electrode 17 may be formed first; and the p-side electrode 16 and the n-side electrode 17 may be formed simultaneously from the same material.

The p-side electrode 16 is reflective with respect to the light emitted from the light emitting layer 13 and includes, for example, silver, silver alloy, aluminum, aluminum alloy, etc. A configuration including a metal protective film also may be used to prevent sulfidization and oxidization of the p-side electrode 16.

For example, a silicon nitride film or a silicon oxide film may be formed as a passivation film between the p-side electrode 16 and the n-side electrode 17, and on the end surface (the side surface) of the light emitting layer 13 by using chemical vapor deposition (CVD). Activation annealing, etc., are implemented if necessary to provide ohmic contact between the electrodes and the semiconductor layer.

Figures 7A, 7B, 7C:
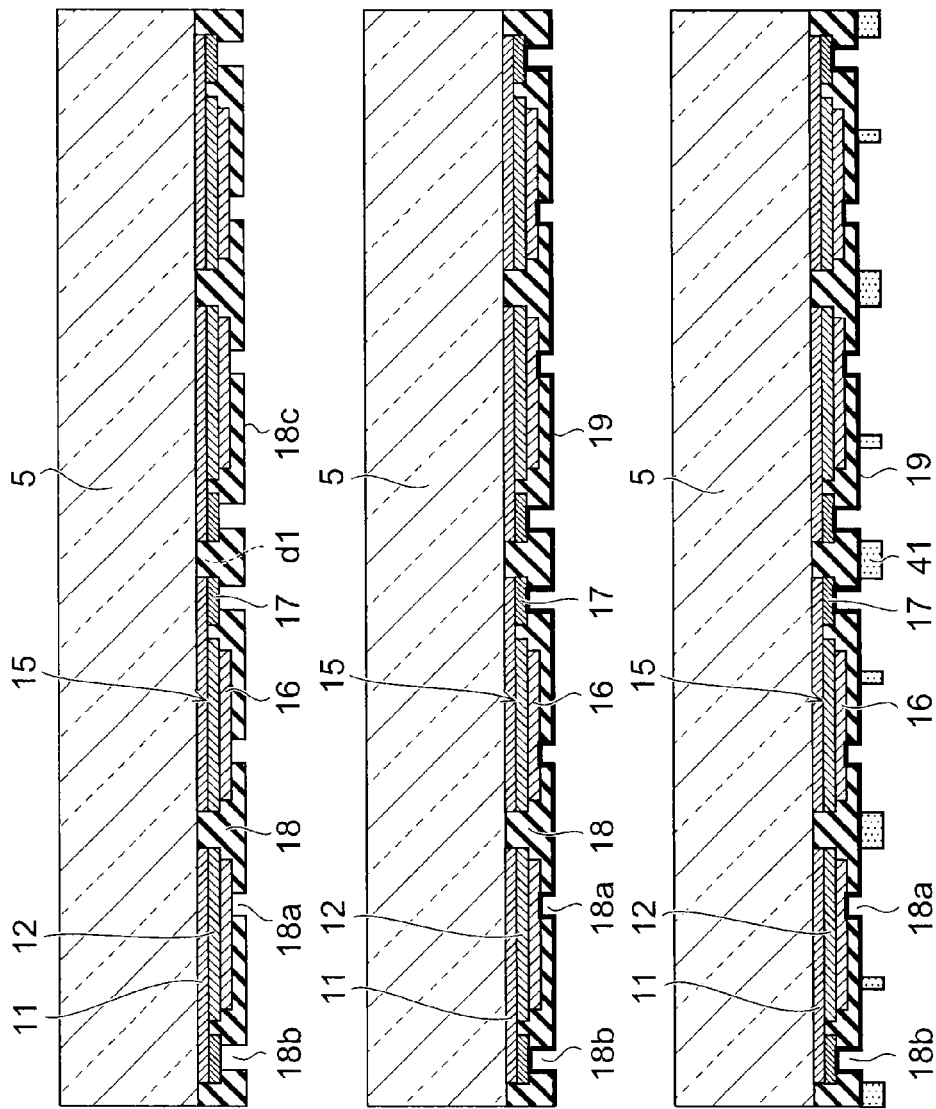

Then, as illustrated in FIG. 7A, all of the exposed portions on the major surface of the substrate 5 are covered with the insulating layer 18; and subsequently, the first via 18a and the second via 18b are made selectively in the insulating layer 18 by patterning the insulating layer 18 using, for example, wet etching. The first via 18a reaches the p-side electrode 16. The second via 18b reaches the n-side electrode 17.

An organic material such as, for example, photosensitive polyimide, benzocyclobutene, etc., can be used as the insulating layer 18. In such a case, the insulating layer 18 may be directly exposed and developed without using a resist. Alternatively, an inorganic film such as a silicon nitride film, a silicon oxide film, etc., may be used as the insulating layer 18. In the case of the inorganic film, the first via 18a and the second via 18b are made using etching after the resist is patterned.

Then, as illustrated in FIG. 7B, a metal film 19 that functions as a seed metal during the plating described below is formed on the interconnect surface 18c (the lower surface in FIG. 7A) which is the surface of the insulating layer 18 on the side opposite to the semiconductor layer 15. The metal film 19 is formed also on the inner wall and the bottom of the first via 18a and on the inner wall and the bottom of the second via 18b.

The metal film 19 is formed using, for example, sputtering. The metal film 19 includes, for example, a stacked film of titanium (Ti) and copper (Cu) stacked in order from the insulating layer 18 side.

Then, as illustrated in FIG. 7C, a resist 41 is selectively formed on the metal film 19; and subsequently, Cu electroplating is performed using the metal film 19 as a current path.

Thereby, as illustrated in FIG. 8A and FIG. 8B which is the bottom view thereof, the first p-side interconnect layer 21 and the first n-side interconnect layer 22 are formed selectively on the interconnect surface 18c of the insulating layer 18. The first p-side interconnect layer 21 and the first n-side interconnect layer 22 are made of, for example, a copper material formed simultaneously using plating.

The first p-side interconnect layer 21 is formed also inside the first via 18a and is electrically connected to the p-side electrode 16 via the metal film 19. The first n-side interconnect layer 22 is formed also inside the second via 18b and is electrically connected to the n-side electrode 17 via the metal film 19.

The resist 41 used in the plating of the first p-side interconnect layer 21 and the first n-side interconnect layer 22 is removed using a solvent or oxygen plasma (FIG. 9A).

Then, as illustrated in FIG. 9B, a resist 42 is formed on the interconnect surface 18c side of the insulating layer 18. The resist 42 is thicker than the resist 41 described above. The resist 41 may remain without being removed in the previous process; and the resist 42 may be formed to overlay the resist 41. A recess 42a and a recess 42b are formed in the resist 42.

Continuing, the metal film 20 that functions as a seed metal during the plating is formed on the inner walls of the recesses 42a and 42b which include the top surface of the resist 42, the top surface of the first p-side interconnect layer 21 exposed at the recess 42a, and the top surface of the first n-side interconnect layer 22 exposed at the recess 42b. The metal film 20 includes, for example, copper.

Then, Cu electroplating is performed using the metal film 20 as a current path. Thereby, as illustrated in FIG. 10A and FIG. 10B which is the bottom view thereof, a metal film 50 is formed on the metal film 20.

The broken lines of FIG. 10B illustrate the edges of the recesses 42a and 42b made in the resist 42. A notch is made in a corner portion of a portion of the recess 42a when viewed in plan; and the metal film 20 and the metal film 50 are not formed on the insulating layer 18 under the notch. Therefore, as described below referring to FIG. 12B, a notch 90 is made in the corner portion of a portion of the second p-side interconnect layer 23.

This plating is conformal plating in which Cu precipitates with a substantially uniform rate to conform to the uneven configuration of the metal film 20 and the resist 42 which is the foundation. Accordingly, the metal film 50 is formed to conform to the uneven configuration of the foundation; and the recess 42a and the recess 42b are not filled with the metal film 50. Accordingly, the plating time and the costs can be reduced compared to the case where the recess 42a and the recess 42b are filled with a metal.

The metal film 50 is formed with substantially the same film thickness at the portions on the first p-side interconnect layer 21 (the bottom of the recess 42a), on the first n-side interconnect layer 22 (the bottom of the recess 42b), on the side wall of the recess 42a, and on the side wall of the recess 42b.

As illustrated in FIG. 10B, the metal film 50 is formed along the side wall of the recess 42a in a closed pattern that encloses the central side of the recess 42a. Similarly, the metal film 50 is formed along the side wall of the recess 42b in a closed pattern that encloses the central side of the recess 42b.

Figures 11A, 11B:
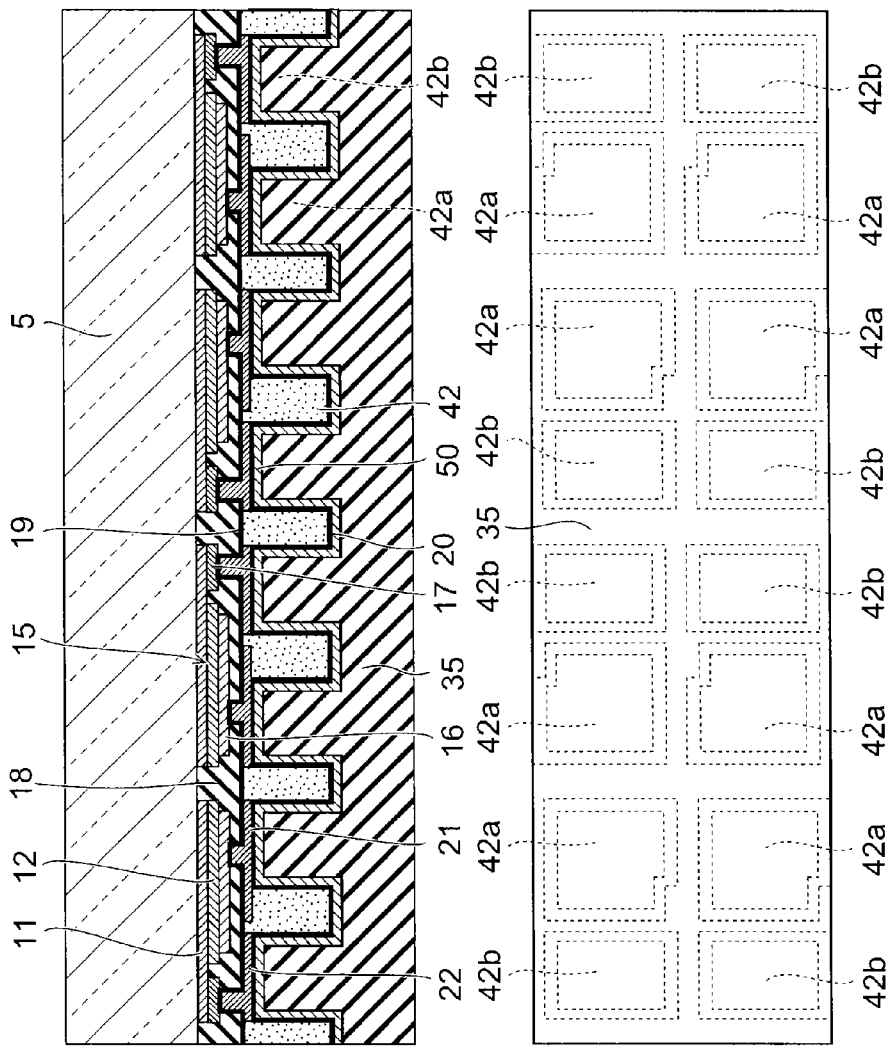

Then, as illustrated in FIG. 11A and FIG. 11B which is the bottom view thereof, the resin layer 35 is formed inside the recess 42a, inside the recess 42b, and on the resist 42 using, for example, printing, molding, etc. The resin layer 35 is filled inside the recess 42a and inside the recess 42b.

The resin layer 35 is insulative. The resin layer 35 may be provided with a light-shielding property with respect to the light emitted from the light emitting layer by containing, for example, carbon black. The resin layer 35 may contain a powder that is reflective with respect to the light emitted from the light emitting layer.

Figures 12A, 12B:
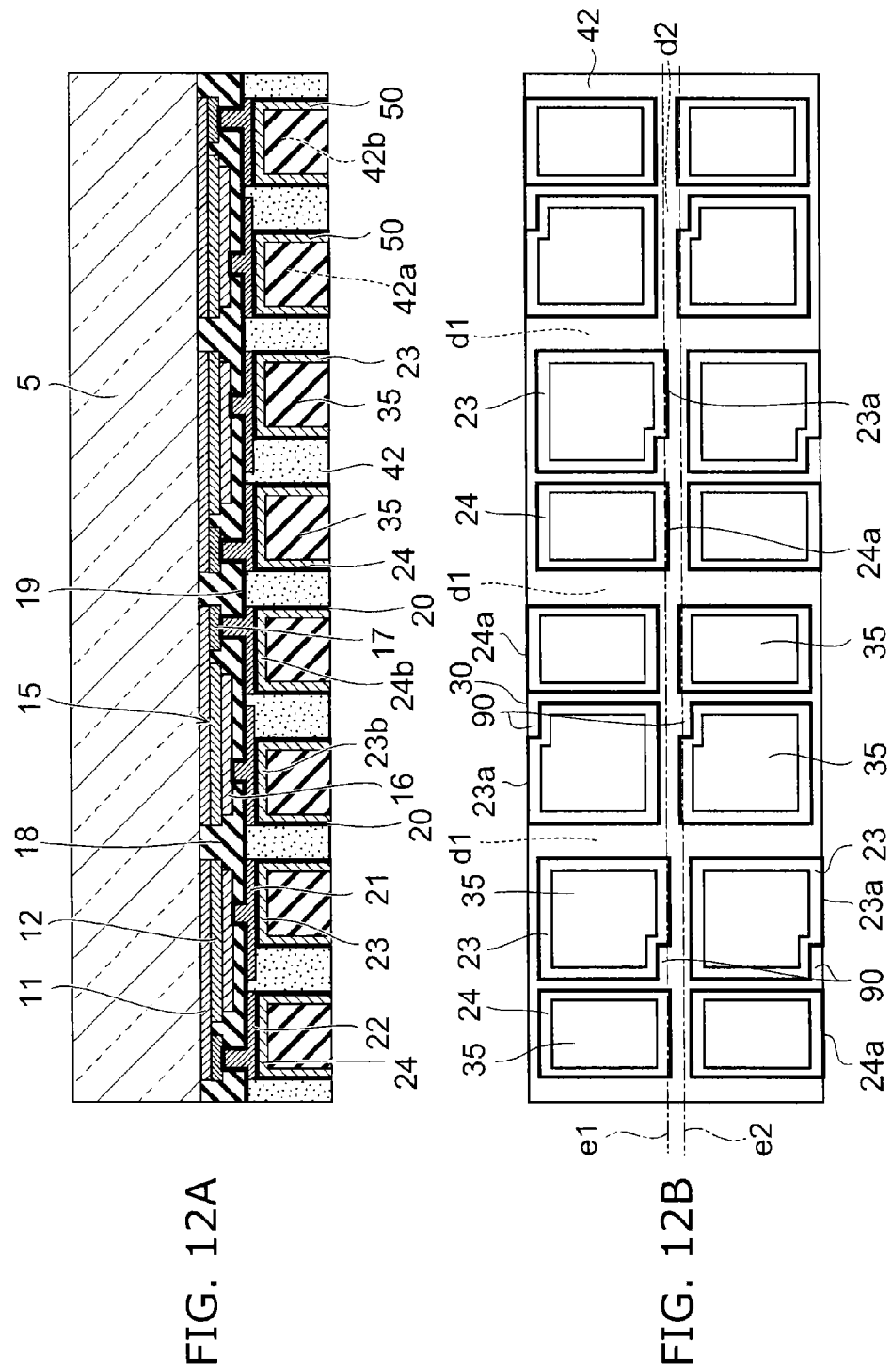

Then, the end portion of the metal film 50 formed on the side walls of the recess 42a and the recess 42b is exposed by polishing the top surface side (the lower surface side of FIG. 11A) of the resin layer 35. The state is illustrated in FIG. 12A and FIG. 12B which is the bottom view thereof.

Thereby, the portion of the metal film 50 inside the recess 42a is partitioned from the portion of the metal film 50 inside the recess 42b. The metal film 50 remaining inside the recess 42a is used to form the second p-side interconnect layer 23. The metal film 50 remaining inside the recess 42b is used to form the second n-side interconnect layer 24.

The second p-side interconnect layer 23 is connected to the first p-side interconnect layer 21 via the metal film 20. Alternatively, the metal film 20 may be included in the second p-side interconnect layer of the embodiment.

The second n-side interconnect layer 24 is connected to the first n-side interconnect layer 22 via the metal film 20. Alternatively, the metal film 20 may be included in the second n-side interconnect layer of the embodiment.

The side wall of a portion of the second p-side interconnect layer 23 is used to form the p-side external terminal 23a exposed at the third surface 30 after the dicing. The side wall of a portion of the second n-side interconnect layer 24 is used to form the n-side external terminal 24a exposed at the third surface 30 after the dicing.

As illustrated in FIG. 12B, the embodiment has a layout in which the p-side external terminal 23a and the n-side external terminal 24a jut onto the dicing region d2 extending in a direction along the third surface 30 described above. Single dot-dash lines e1 and e2 of FIG. 12B illustrate the two edges of the dicing blade respectively.

The notch 90 is made in the corner portion of a portion of the second p-side interconnect layer 23 on the second n-side interconnect layer 24 side. The notch 90 is formed between the p-side external terminal 23a and the n-side external terminal 24a. Therefore, the separation distance between the p-side external terminal 23a and the n-side external terminal 24a exposed to the outside after the dicing can be a distance sufficient to avoid shorts due to solder, etc., when mounting.

The portions of the second p-side interconnect layer 23 where the notch 90 is not made can be proximal to the second n-side interconnect layer 24 to the limitations of the processes; and the surface area of the second p-side interconnect layer 23 can be increased. As a result, the current distribution and the heat dissipation can be improved.

The p-side external terminal 23a and the n-side external terminal 24a exist on both width-direction sides of the dicing region d2 without existing with a bias toward one width-direction side of the dicing region d2. In other words, the p-side external terminal 23a and the n-side external terminal 24a, which are metals, do not exist with a bias toward one width-direction edge side of the dicing blade.

The case where the dicing region d2 is subdivided using a blade from left to right for a wafer including a layout such as that illustrated in FIG. 12B will now be described.

In the case where one light emitting element is taken to be a pair of one second p-side interconnect layer 23 and one second n-side interconnect layer 24, the light emitting elements are arranged in FIG. 12B with four in the lateral direction and two in the vertical direction.

In FIG. 12B, the light emitting element at the leftmost top and the light emitting element second from the right at the top have a portion of the second p-side interconnect layer 23 (the lower side) and a portion of the second n-side interconnect layer 24 (the lower side) that exist in the dicing region d2. In FIG. 12B, the light emitting element at the rightmost bottom and the light emitting element second from the left at the bottom have a portion of the second p-side interconnect layer 23 (the upper side) and a portion of the second n-side interconnect layer 24 (the upper side) that exist in the dicing region d2.

In the case where the dicing region d2 is subdivided using a blade from left to right, the upper side of the blade in FIG. 12B has a higher proportion in contact with metal than does the lower side when cutting between the leftmost light emitting elements on the top and the bottom; and when cutting between the light emitting elements second from the left on the top and the bottom, this is the reverse of that of the leftmost, and the lower side of the blade in FIG. 12B has a higher proportion in contact with metal than does the upper side. Therefore, the occurrence of clogging, damage, etc., due to an excessive load on one width-direction edge of the dicing blade when dicing can be suppressed.

Although the p-side external terminal 23a and the n-side external terminal 24a existing on the edge e1 side are arranged alternately with the p-side external terminal 23a and the n-side external terminal 24a existing on the edge e2 side as viewed from the direction in which the dicing region d2 extends in FIG. 12B, this is not limited to such a layout. It is sufficient for the p-side external terminal 23a and the n-side external terminal 24a not to exist with a bias toward the side of one selected from the edge e1 and the edge e2.

Even in the case where the p-side external terminal 23a and the n-side external terminal 24a exist with a bias toward one side of one selected from the edge e1 and the edge e2, the clogging, damage, etc., of the blade when dicing can be suppressed by increasing the replacement frequency of the blade, etc.

By exposing the end portion of the second p-side interconnect layer 23 on the lower side of FIG. 12A and the end portion of the second n-side interconnect layer 24 on the lower side of FIG. 12A, various inspections can be performed by causing the light emitting device to emit light by supplying a current by bringing measurement probes of different polarities into contact with the end portions respectively. Inspections may be performed at the wafer level for which handling is easy.

Then, the resist 42 is removed using, for example, a solvent or oxygen plasma (FIG. 13A). The resin layer 35 enclosed with the second p-side interconnect layer 23 and a resin layer 34 enclosed with the second n-side interconnect layer 24 remain.

Subsequently, the exposed portions of the metal film 19 formed on the interconnect surface 18c are removed by wet etching using the p-side interconnect structure portion including the first p-side interconnect layer 21, the second p-side interconnect layer 23, and the resin layer 35, and the n-side interconnect structure portion including the first n-side interconnect layer 22, the second n-side interconnect layer 24, and the resin layer 35 as a mask. Thereby, as illustrated in FIG. 13B, the electrical connection between the first p-side interconnect layer 21 and the first n-side interconnect layer 22 via the metal film 19 is broken.

Figures 14A, 14B:
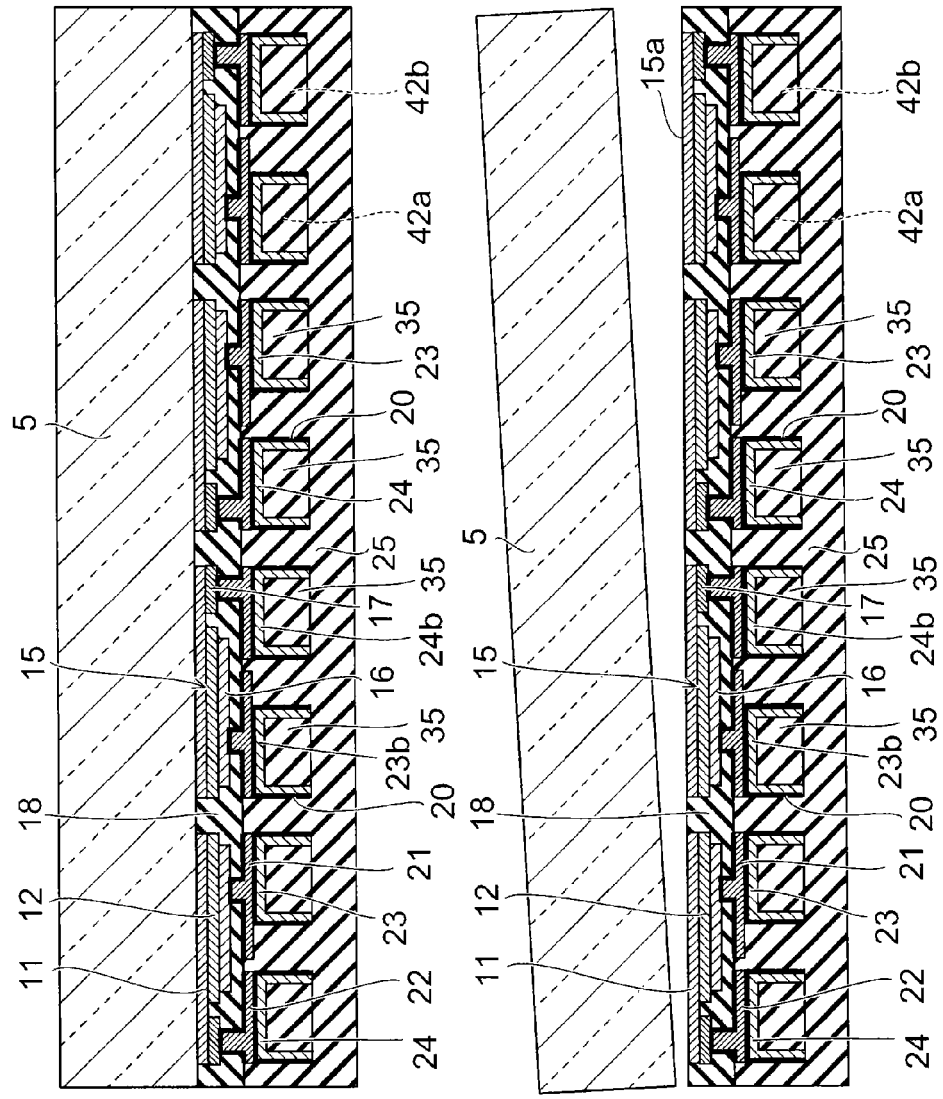

Then, as illustrated in FIG. 14A, the resin layer 25 is stacked on the insulating layer 18. The resin layer 25 covers the p-side interconnect structure portion and the n-side interconnect structure portion described above.

The resin layer 25 is insulative. The resin layer 25 may be provided with a light-shielding property with respect to the light emitted from the light emitting layer by the resin layer 25 containing, for example, carbon black. The resin layer 25 may contain a powder that is reflective with respect to the light emitted from the light emitting layer. The adhesion strength between the resin layer 25 and the resin layer 35 can be increased and the reliability can be increased by forming the resin layer 25 and the resin layer 35 of the same material.

Then, as illustrated in FIG. 14B, the substrate 5 is removed. The substrate 5 is removed by, for example, laser lift-off. Specifically, laser light is irradiated from the back surface side of the substrate 5 toward the first semiconductor layer 11. The laser light is transmissive with respect to the substrate 5 and has a wavelength in the absorption region of the first semiconductor layer 11.

When the laser light reaches the interface between the substrate 5 and the first semiconductor layer 11, the first semiconductor layer 11 proximal to the interface decomposes by absorbing the energy of the laser light. For example, in the case where the first semiconductor layer 11 is GaN, the first semiconductor layer 11 decomposes into gallium (Ga) and nitrogen gas. A micro gap is made between the substrate 5 and the first semiconductor layer 11 by the decomposition reaction; and the substrate 5 and the first semiconductor layer 11 separate.

The irradiation of the laser light is performed over the entire wafer by performing multiply for every set region; and the substrate 5 is removed.

Because the stacked body described above formed on the major surface of the substrate 5 is reinforced by the thick resin layer 25, it is possible to maintain the wafer state even in the case where there is no substrate 5. The resin layers 25 and 35 and the metals included in the interconnect layers are materials more flexible than the semiconductor layer 15. Therefore, destruction of the device can be avoided even in the case where the large internal stress generated in the epitaxial process that forms the semiconductor layer 15 on the substrate 5 is relieved all at once when peeling the substrate 5.

The first surface 15a of the semiconductor layer 15 from which the substrate 5 is removed is cleaned. For example, the gallium (Ga) adhered to the first surface 15a is removed using hydrochloric acid, etc.

Etching (frosting) is performed on the first surface 15a using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation (FIG. 15A). Alternatively, the unevenness may be formed in the first surface 15a by performing etching after the patterning using the resist. The light extraction efficiency can be increased by the unevenness being formed in the first surface 15a.

Then, as illustrated in FIG. 15B, the lens 26 is formed on the first surface 15a. The lens 26 is transparent to the light emitted from the light emitting layer and may include, for example, a silicone resin, an acrylic resin, glass, etc. The lens 26 may be formed by etching using, for example, a grayscale mask or imprinting.

Then, the phosphor layer 27 is formed on the first surface 15a and on the insulating layer 18 exposed between the mutually-adjacent semiconductor layers 15 to cover the lens 26. For example, a liquid transparent resin in which phosphor particles are dispersed is supplied using a method such as printing, potting, molding, compression molding, etc., and is subsequently thermally cured. The transparent resin is transmissive with respect to the light emitted from the light emitting layer and the light emitted by the fluorescer and may include a material such as, for example, a silicone resin, an acrylic resin, liquid glass, etc.

Continuing as illustrated in FIG. 16A and FIG. 16B which is the bottom view thereof, singulation into the multiple light emitting devices 10a is performed by cutting the phosphor layer 27, the insulating layer 18, and the resin layer 25 at the positions of the dicing regions d1 and d2 formed in the lattice configuration. For example, the cutting is performed using a dicing blade. Alternatively, the cutting may be performed using laser irradiation.

At this time, the portions of the second p-side interconnect layer 23 and the second n-side interconnect layer 24 jutting into the dicing region d2 extending in the direction along the third surface 30 are cut. Thereby, the p-side external terminal 23a and the n-side external terminal 24a are exposed at the third surface 30.

Because the metal film 20 used as the seed metal during the plating described above is thin, the metal film 20 formed on the p-side external terminal 23a and the n-side external terminal 24a is removed when dicing.

Similarly, if portions of the first p-side interconnect layer 21 and the first n-side interconnect layer 22 jut into the dicing region d2, such portions jutting into the dicing region d2 are cut. Thereby, the side surface 21a of the first p-side interconnect layer 21 and the side surface 22a of the first n-side interconnect layer 22 also are exposed at the third surface 30.

Alternatively, because the film thickness of the first p-side interconnect layer 21 and the film thickness of the first n-side interconnect layer 22 are thin, the exposed surface area of the third surface 30 is extremely small compared to the p-side external terminal 23a and the n-side external terminal 24a. Accordingly, the first p-side interconnect layer 21 and the first n-side interconnect layer 22 may not be exposed at the third surface 30. The function of the external terminals is sufficiently provided by just the p-side external terminal 23a and the n-side external terminal 24a.

Figure 31:
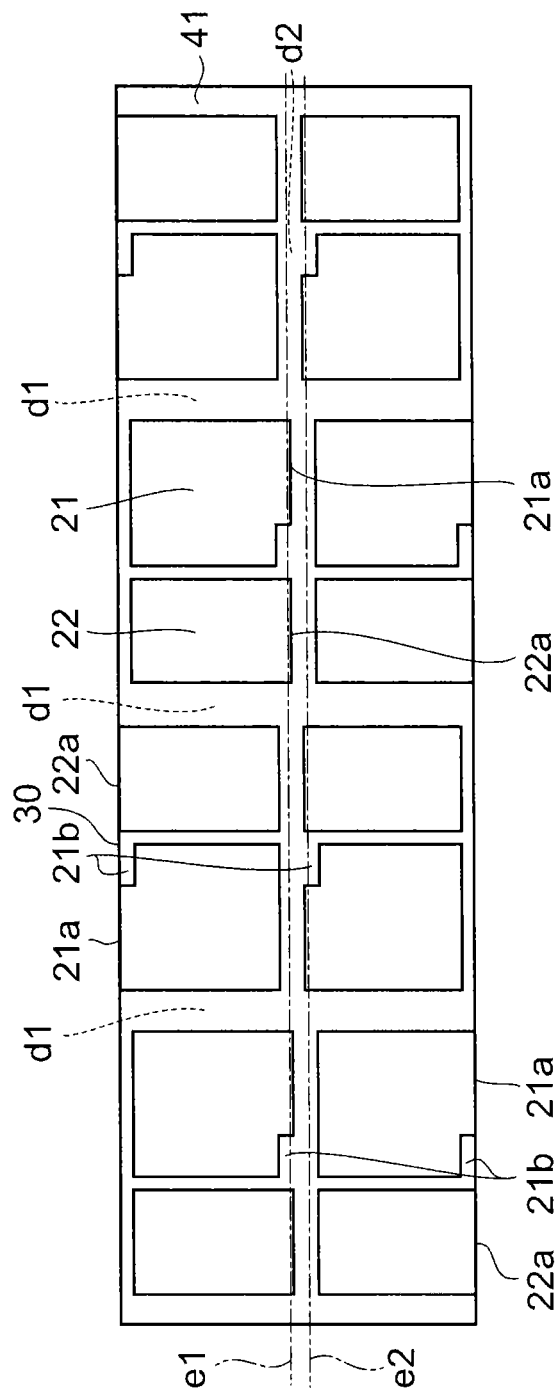
FIG. 31 is a schematic view of another layout of a first p-side interconnect layer and a first n-side interconnect layer.

The layout illustrated in FIG. 31 is notable in the case where a portion of the first p-side interconnect layer 21 and a portion of the first n-side interconnect layer 22 are exposed at the third surface 30.

In FIG. 31, the dicing region d2 extends in a direction (in FIG. 31, the lateral direction) along the side surface 21a of the first p-side interconnect layer 21 and the side surface 22a of the first n-side interconnect layer 22 exposed at the third surface 30. The side surface 21a and the side surface 22a jut onto the dicing region d2. In FIG. 31, the single dot-dash lines e1 and e2 illustrate the two edges of the dicing blade respectively.

A notch 21b is made in a portion of the first p-side interconnect layer 21 on the first n-side interconnect layer 22 side and on the side surface 21a side. The notch 21b is formed between the side surface 21a and the side surface 22a. Therefore, the separation distance between the side surface 21a and the side surface 22a exposed to the outside after the dicing can be a distance sufficient to avoid shorts due to solder, etc., when mounting.

In the portion where the notch 21b is not made, the first p-side interconnect layer 21 can be proximal to the first n-side interconnect layer 22 to the limitations of the processes; and the surface area of the first p-side interconnect layer 21 can be increased. As a result, the first p-side interconnect layer 21 and the p-side electrode 16 can be connected through the multiple first vias 18a; and the current distribution and the heat dissipation can be improved.

The side surface 21a and the side surface 22a exist on both width-direction sides of the dicing region d2 without existing with a bias toward one width-direction side of the dicing region d2. In other words, the side surface 21a and the side surface 22a, which are metals, do not exist with a bias toward one width-direction edge side of the dicing blade. Therefore, the occurrence of clogging, damage, etc., due to an excessive load on one width-direction edge of the dicing blade when dicing can be suppressed.

Although the side surface 21a and the side surface 22a existing on the edge e1 side are arranged alternately with the side surface 21a and the side surface 22a existing on the edge e2 side as viewed from the direction in which the dicing region d2 extends in FIG. 31, this is not limited to such a layout. It is sufficient for the side surface 21a and the side surface 22a not to exist with a bias toward one side of one selected from the edge e1 and the edge e2.

Even in the case where the side surface 21a and the side surface 22a exist with a bias toward one side of one selected from the edge e1 and the edge e2, the clogging, damage, etc., of the blade when dicing can be suppressed by increasing the replacement frequency of the blade, etc.

The substrate 5 is already removed when dicing. Further, the damage to the semiconductor layer 15 when dicing can be avoided because the semiconductor layer 15 does not exist in the dicing regions d1 and d2. After the singulation, a structure is obtained in which the end portion (the side surface) of the semiconductor layer 15 is protected by being covered with the resin.

The singulated light emitting device 10a may have a single-chip structure including one semiconductor layer 15 or a multi-chip structure including multiple semiconductor layers 15.

Because each of the processes described above until the dicing can be performed collectively in the wafer state, it is unnecessary to perform the interconnects and the packaging for every singulated individual device; and it becomes possible to drastically reduce the production costs. In other words, the interconnects and the packaging are already complete in the singulated state. Therefore, the productivity can be increased; and as a result, price reductions become easy.

Figure 17A:
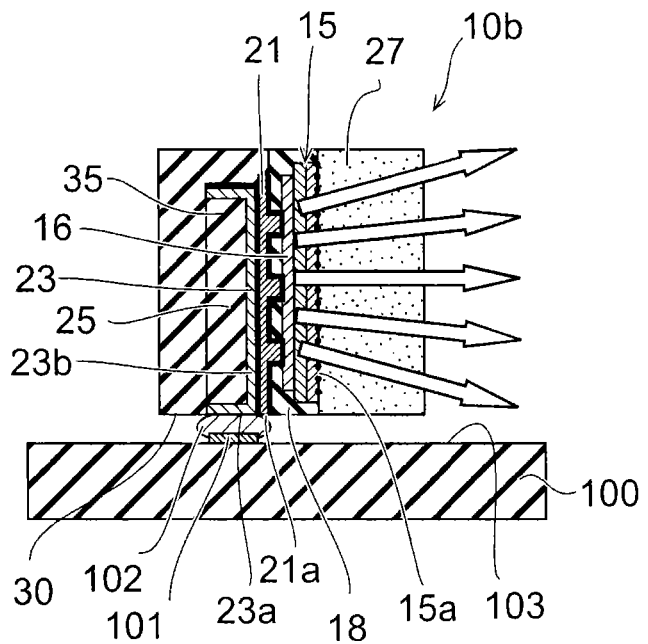
FIGS. 17A and 17B are schematic cross-sectional views of another example of the light emitting module of the first embodiment.

As in the light emitting device 10b illustrated in FIG. 17A, a structure may be used in which the lens is not provided on the first surface 15a side.

Figure 17B:
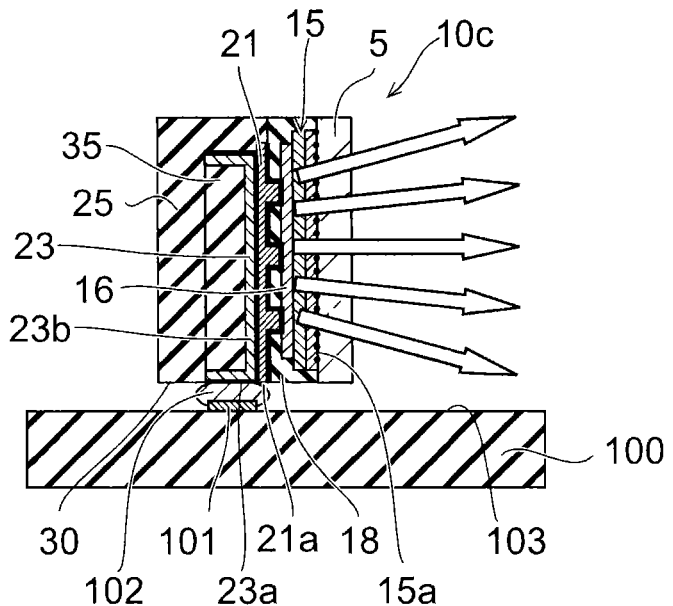

As in the light emitting device 10c illustrated in FIG. 17B, the substrate 5 may thinly remain on the first surface 15a. For example, the substrate 5 can be polished using a grinder for polishing a semiconductor wafer back surface, etc.

The substrate 5 is, for example, a sapphire substrate and is transmissive with respect to the light emitted from the nitride semiconductor-based light emitting layer. Because there is no phosphor layer in such a case, light having the same wavelength as the light emitted from the light emitting layer is emitted to the outside from the light emitting device 10c. Of course, the phosphor layer may be formed on the substrate 5. By leaving the substrate 5, the mechanical strength can be increased; and a structure having high reliability may be provided.

When dicing, the substrate 5 can be subdivided using laser irradiation after performing a half-cut using the dicing blade from the resin layer 25 side. Alternatively, all of the portions may be cut using laser irradiation.

Second Embodiment

Figure 18A:
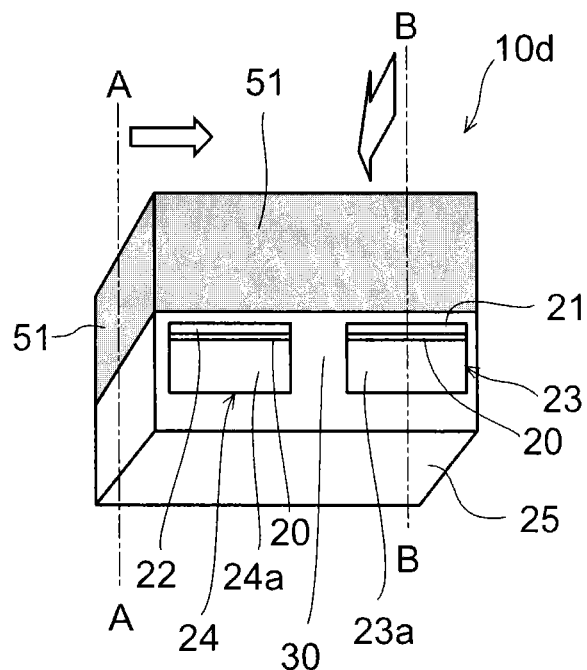
FIGS. 18A and 18B are schematic perspective views of a light emitting device of a second embodiment.

FIG. 18A is a schematic perspective view as viewed from the third surface 30 side of a light emitting device 10d of a second embodiment.

Figure 18B:
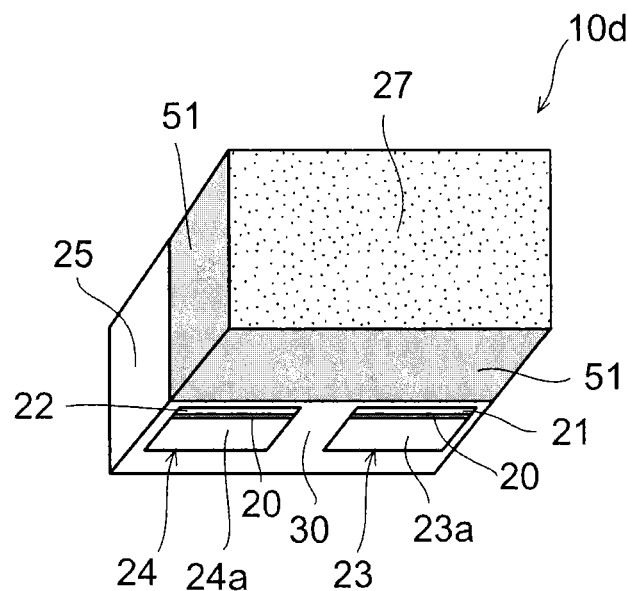

FIG. 18B is a schematic perspective view as viewed from the light emitting surface side of the light emitting device 10d.

Figure 19A:
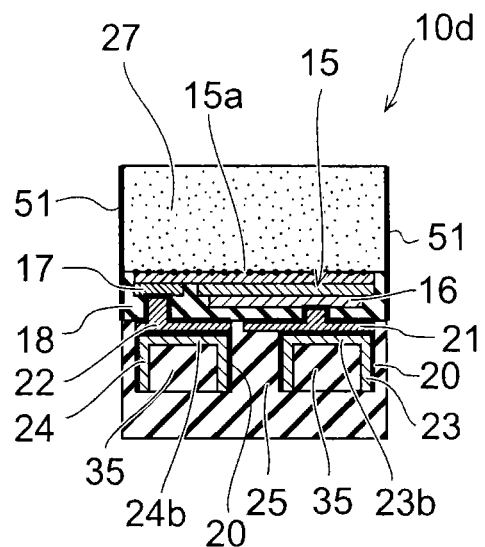
FIGS. 19A and 19B are schematic cross-sectional views of the light emitting device of the second embodiment.

FIG. 19A is an A-A cross-sectional view of FIG. 18A.

Figure 19B:
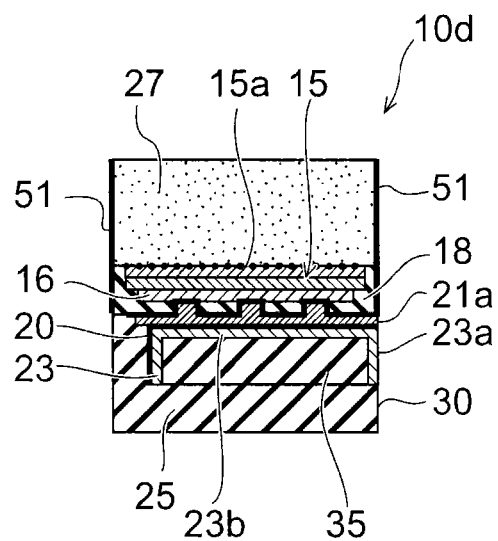

FIG. 19B is a B-B cross-sectional view of FIG. 18A.

The light emitting device 10d of this embodiment differs from the light emitting device 10a of the first embodiment by including a reflective film 51.

The reflective film 51 is reflective with respect to the light emitted from the light emitting layer and emitted by the phosphor and is, for example, a metal film. The reflective film 51 is formed on the side surface of the phosphor layer 27 and the side surface of the insulating layer 18. The reflective film 51 is not formed on the surface of the phosphor layer 27 on the side opposite to the first surface 15a.

Figure 20:
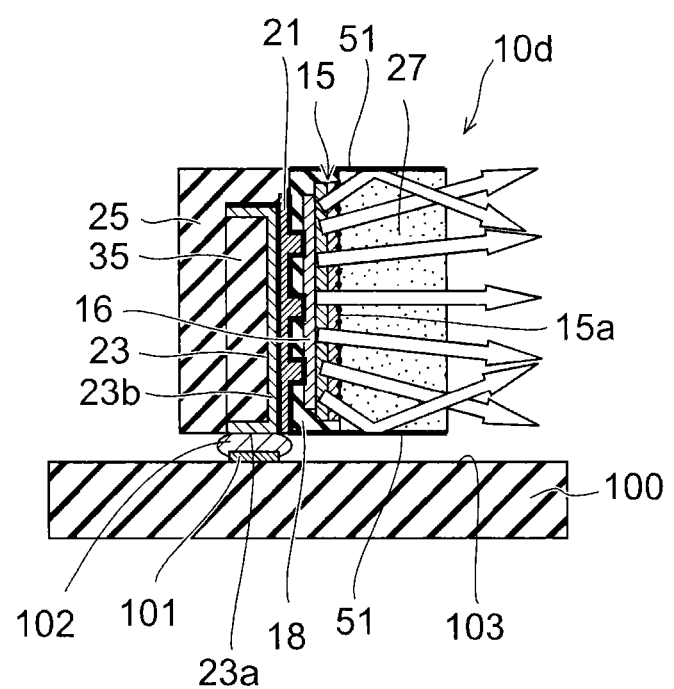
FIG. 20 is a schematic cross-sectional view of a light emitting module of the second embodiment.

FIG. 20 is a schematic cross-sectional view of a light emitting module having a configuration in which the light emitting device 10d of this embodiment is mounted on the mounting substrate 100.

Similarly to the first embodiment, the light emitting device 10d is mounted with an orientation in which the third surface 30 faces the mounting surface 103 of the mounting substrate 100. The p-side external terminal 23a and the n-side external terminal 24a exposed at the third surface 30 are bonded respectively to the pads 101 formed in the mounting surface 103 via the solder 102, etc.

The third surface 30 is substantially perpendicular to the first surface 15a which is the main emitting surface of the light. Accordingly, the first surface 15a is configured to face the lateral direction instead of upward from the mounting surface 103 when the third surface 30 faces downward toward the mounting surface 103 side. In other words, a so-called side-view type light emitting device 10d and light emitting module are obtained in which the light is emitted in the lateral direction in the case where the mounting surface 103 is taken to be a horizontal surface.

Because the side surfaces of the insulating layer 18 and the phosphor layer 27 are covered with the reflective film 51, the light is emitted by being concentrated in the lateral direction.

A method for manufacturing the light emitting device 10d of this embodiment will now be described with reference to FIG. 21A to FIG. 23B.

FIG. 21A illustrates the state in which the substrate 5 is removed and the phosphor layer 27 is formed on the first surface 15a. Up to this process, the processes may progress similarly to the first embodiment described above.

Then, half-cut dicing is performed on the stacked body illustrated in FIG. 21A from the phosphor layer 27 side. Specifically, the phosphor layer 27 and the insulating layer 18 are cut at the positions of the dicing regions d1 and d2. For example, the cutting is performed using a dicing blade or laser irradiation. Thereby, a trench 52 (FIG. 21B) is made in the dicing regions d1 and d2.

Continuing, the reflective film 51 is formed on the exposed surface using, for example, sputtering. As illustrated in FIG. 22A, the reflective film 51 is formed on the top surface of the phosphor layer 27 and on the bottom and the inner wall of the trench 52.

For example, silver, aluminum, gold, silicon, a dielectric multilayered film, etc., may be used as the reflective film 51. Alternatively, a resin including a reflective powder may be used as the reflective film 51.

Then, as illustrated in FIG. 22B, the reflective film 51 formed in the top surface of the phosphor layer 27 is removed by polishing. For example, a grinder, etc., for polishing a semiconductor wafer back surface may be used. Alternatively, the reflective film 51 formed on the top surface of the phosphor layer 27 may be removed using RIE. The reflective film 51 remains on the side surface of the phosphor layer 27 and the side surface of the insulating layer 18.

Continuing as illustrated in FIG. 23A and FIG. 23B which is the bottom view thereof, the resin layer 25 under the trench 52 is cut. For example, the cutting is performed using a dicing blade. Alternatively, the cutting may be performed using laser irradiation. Thereby, singulation into the multiple light emitting devices 10d is performed.

At this time as well, similarly to the first embodiment, the portions of the second p-side interconnect layer 23 and the second n-side interconnect layer 24 that jut into the dicing region d2 extending in the direction along the third surface 30 are cut. Thereby, the p-side external terminal 23a and the n-side external terminal 24a are exposed at the third surface 30.

In this embodiment as well, the dicing can be easy and the productivity can be increased because the resin is cut. Because the semiconductor layer 15 is not cut, damage to the semiconductor layer 15 when dicing can be avoided.

Third Embodiment

Figure 24A:
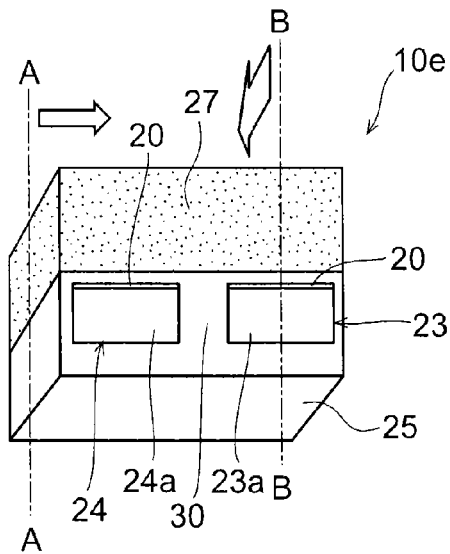
FIGS. 24A to 24C are schematic perspective views of a light emitting device of a third embodiment.
Figure 24B:
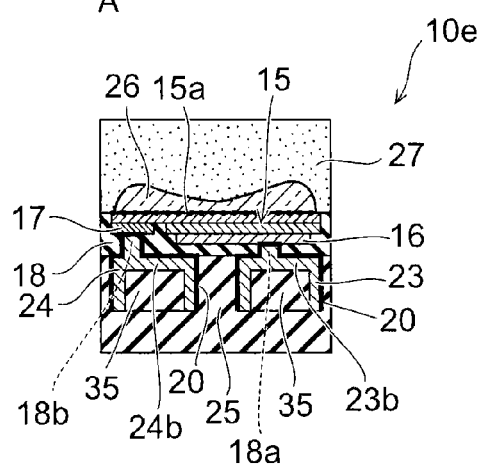
Figure 24C:
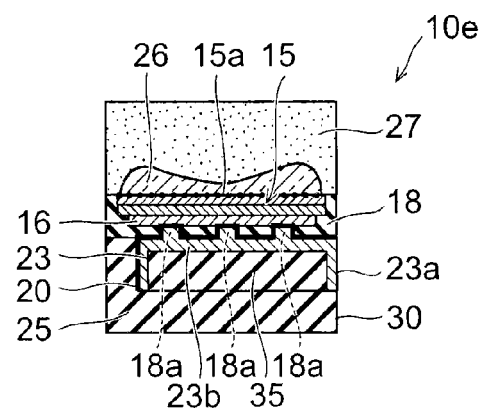

FIG. 24A is a schematic perspective view of a light emitting device 10e of a third embodiment. FIG. 24B is an A-A cross-sectional view of FIG. 24A. FIG. 24C is a B-B cross-sectional view of FIG. 24A.

In the light emitting device 10e of this embodiment, a portion of the second p-side interconnect layer 23 is provided inside the first via 18a without providing the first p-side interconnect layer 21 of the embodiment recited above. Also, a portion of the second n-side interconnect layer 24 is provided inside the second via 18b without providing the first n-side interconnect layer 22. In other words, the p-side interconnect layer includes the second p-side interconnect layer 23; and the n-side interconnect layer includes the second n-side interconnect layer 24.

Processes can be eliminated and costs can be reduced by the first p-side interconnect layer 21 and the first n-side interconnect layer 22 not being provided.

Figure 25:
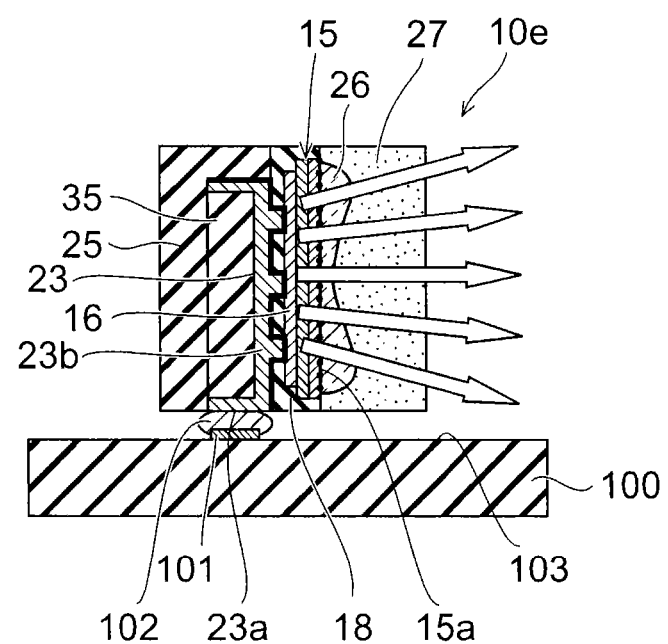
FIG. 25 is a schematic cross-sectional view of a light emitting module of the third embodiment.

FIG. 25 is a schematic cross-sectional view of a light emitting module having a configuration in which the light emitting device 10e of this embodiment is mounted on the mounting substrate 100.

In this embodiment as well, the light emitting device 10e is mounted with an orientation in which the third surface 30 faces the mounting surface 103 of the mounting substrate 100. The p-side external terminal 23a and the n-side external terminal 24a exposed at the third surface 30 are bonded respectively to the pads 101 formed in the mounting surface 103 via the solder 102, etc.

The third surface 30 is substantially perpendicular to the first surface 15a which is the main emitting surface of the light. Accordingly, the first surface 15a is configured to face the lateral direction instead of upward from the mounting surface 103 when the third surface 30 faces downward toward the mounting surface 103 side. In other words, a so-called side-view type light emitting device 10e and light emitting module are obtained in which light is emitted in the lateral direction in the case where the mounting surface 103 is taken to be a horizontal surface.

Fourth Embodiment

Figure 26A:
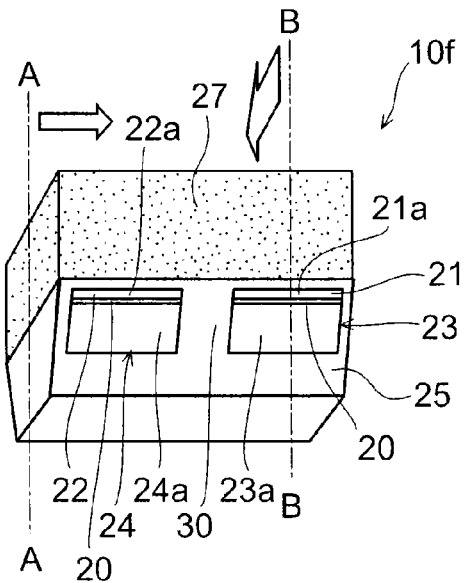
FIGS. 26A to 26C are schematic perspective views of a light emitting device of a fourth embodiment.
Figure 26B:
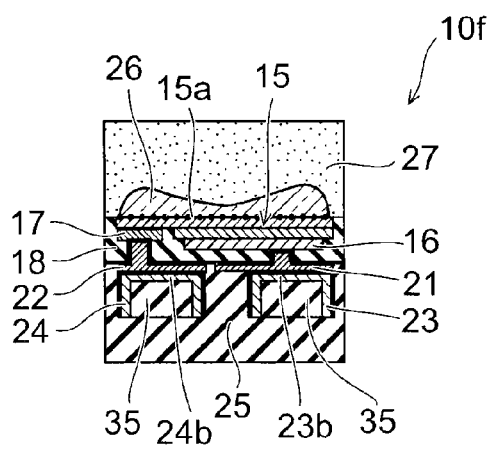
Figure 26C:
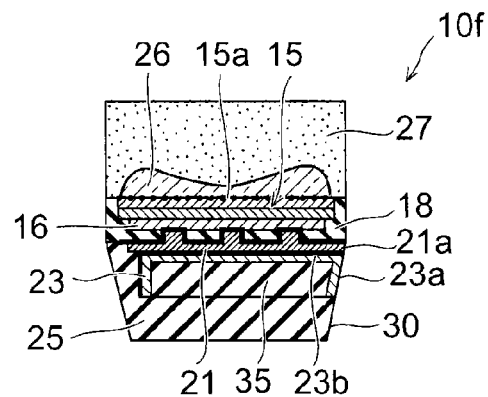

FIG. 26A is a schematic perspective view of a light emitting device 10f of a fourth embodiment. FIG. 26B is an A-A cross-sectional view of FIG. 26A. FIG. 26C is a B-B cross-sectional view of FIG. 26A.

The third surface 30 of the light emitting device 10f of this embodiment is neither perpendicular nor parallel to the first surface 15a but is tilted with respect to the first surface 15a.

The third surface 30 is tilted such that the exterior form of the resin layer 25 has an inverted trapezoidal configuration in the cross section of FIG. 26C corresponding to the B-B cross section of FIG. 26A.

The p-side external terminal 23a of the second p-side interconnect layer 23, the n-side external terminal 24a of the second n-side interconnect layer 24, the side surface 21a of the first p-side interconnect layer 21, and the side surface 22a of the first n-side interconnect layer 22 exposed at the third surface 30 are tilted to conform to the tilt of the third surface 30.

Figure 27:
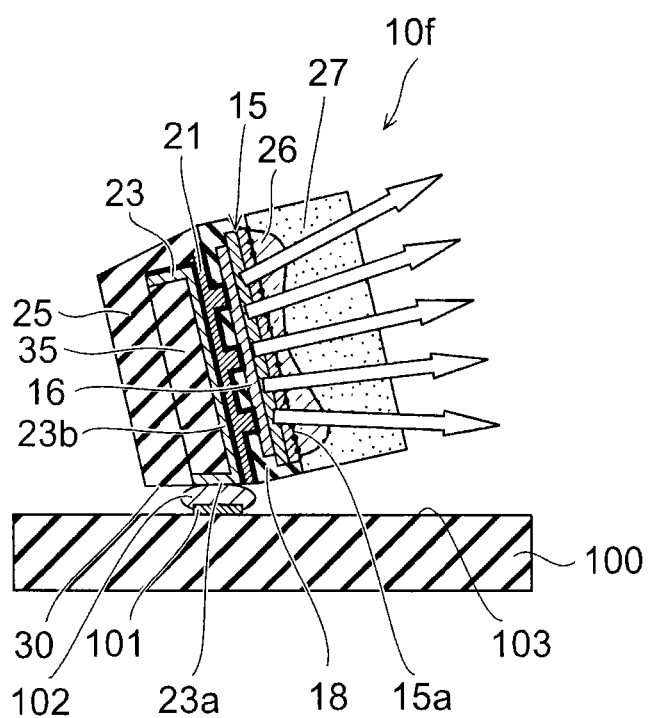
FIG. 27 is a schematic cross-sectional view of a light emitting module of the fourth embodiment.

FIG. 27 is a schematic cross-sectional view of a light emitting module having a configuration in which the light emitting device 10f of this embodiment is mounted on the mounting substrate 100.

The light emitting device 10f is mounted with an orientation in which the third surface 30 faces the mounting surface 103 of the mounting substrate 100. The p-side external terminal 23a and the n-side external terminal 24a exposed at the third surface 30 are bonded respectively to the pads 101 formed in the mounting surface 103 via the solder 102, etc.

In this embodiment as well, the p-side external terminal 23a and the n-side external terminal 24a are exposed at the third surface 30 of the plane orientation different from the first surface 15a and the second surface on the side opposite to the first surface 15a. Therefore, a side-view type light emitting device 10f and light emitting module are obtained in which light is emitted in the lateral direction in the state in which the mounting surface faces downward.

Also, the first surface 15a faces obliquely upward when the third surface 30 faces downward toward the mounting surface 103 side because the third surface 30 is tilted with respect to the first surface 15a. In other words, the light is emitted obliquely upward in the case where the mounting surface 103 is taken to be a horizontal surface.

A method for manufacturing the light emitting device 10f of this embodiment will now be described with reference to FIG. 28A to FIG. 29B.

Figure 29A:
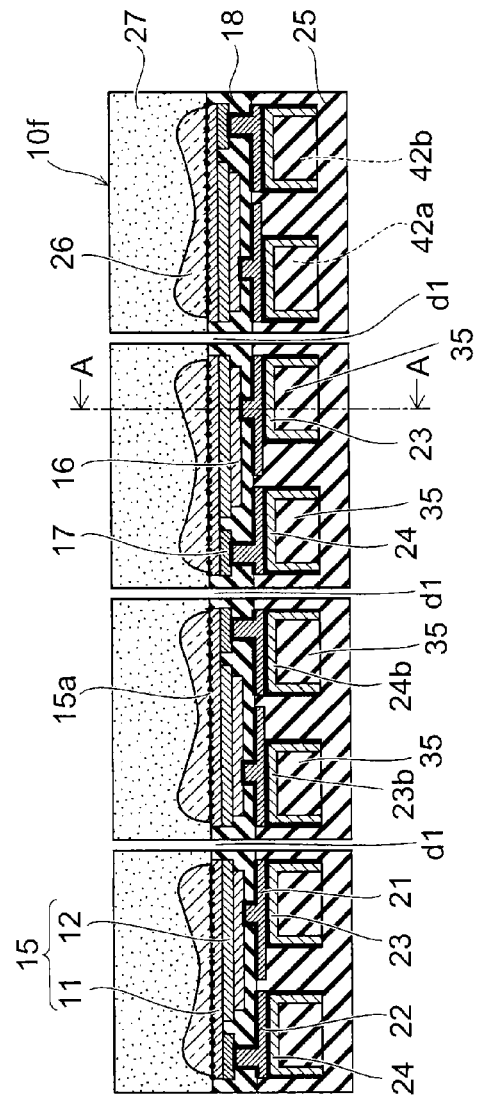
Figure 29B:
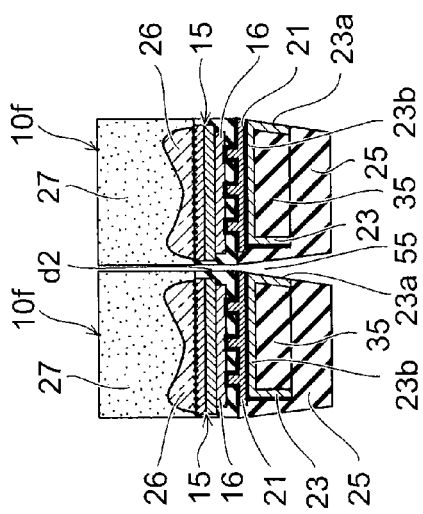

FIG. 28B corresponds to the A-A cross section of FIG. 28A; and FIG. 29B corresponds to the A-A cross section of FIG. 29A.

As illustrated in FIG. 28A, the processes may progress similarly to the first embodiment up to the process of forming the phosphor layer 27.

Then, the resin layer 25 is cut at the position of the dicing region d2 illustrated in FIG. 12B described above using a blade of which, for example, both width-direction side surfaces are formed with tapers. Thereby, as illustrated in FIG. 28B, a trench 55 is made under the dicing region d2. The trench 55 reaches the insulating layer 18 by piercing the resin layer 25. The trench 55 widens gradually away from the insulating layer 18 side.

In this embodiment as well, the p-side external terminal 23a and the n-side external terminal 24a jut into the dicing region d2. Accordingly, the p-side external terminal 23a and the n-side external terminal 24a are exposed at the trench 55.

Then, the insulating layer 18 and the phosphor layer 27 on the trench 55 are cut along the dicing region d2. Further, the phosphor layer 27, the insulating layer 18, and the resin layer 25 are cut along the dicing region d1 orthogonal to the dicing region d2. Thereby, as illustrated in FIGS. 29A and 29B, singulation into the multiple light emitting devices 10f is performed.

In the direction along the dicing region d1 as well, the side surface of the resin layer 25 illustrated in FIG. 29A may be tilted by dicing using a blade of which both width-direction side surfaces are formed with tapers.

Figure 30A:
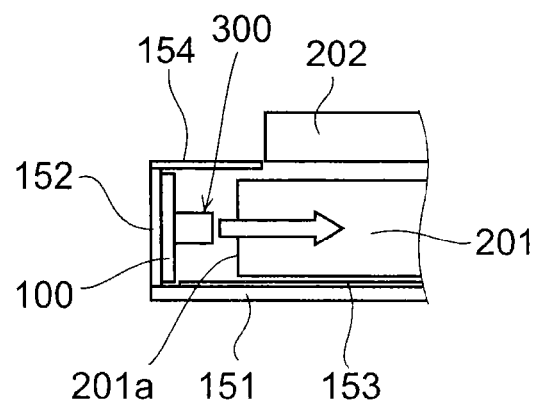
FIG. 30A is a schematic view of an illumination apparatus in which a light emitting module of a comparative example is used.
Figure 30B:
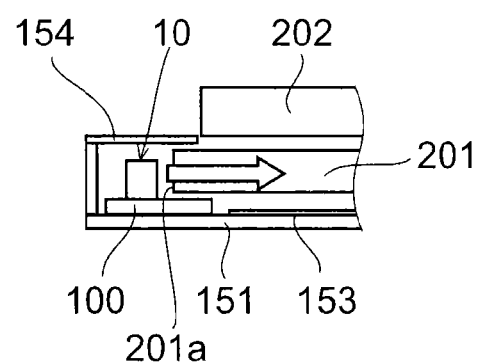
FIG. 30B is a schematic view of an illumination apparatus in which the light emitting module of the embodiment is used.

FIG. 30B is a schematic view of a specific example in which the light emitting module of the embodiment is used as, for example, a backlight of a liquid crystal display apparatus.

Here, a light emitting device 10 mounted on the mounting substrate 100 is illustrated as one typical light emitting device selected from the embodiments described above.

The mounting substrate 100 is provided on a frame 151. Because the light emitting device 10 is the side-view type, the light is emitted in the lateral direction as illustrated by the white arrow of the drawing in the state in which the mounting substrate 100 faces downward.

The mounting substrate 100 is formed, for example, in a rectangular plate configuration extending into the page surface; and the multiple light emitting devices 10 are mounted in the longitudinal direction of the mounting substrate 100.

A light guide plate 201 is provided beside the light emitting module. The light guide plate 201 is transmissive with respect to the light emitted from the light emitting device 10 and is made of, for example, a resin material. The light emitting surface of the light emitting device 10 opposes a light incident surface 201a of the light guide plate 201.

A reflector 153 is provided below the light guide plate 201; and a liquid crystal panel 202 is provided above the light guide plate 201. A reflector 154 is provided above the light emitting device 10. The reflectors 153 and 154 are reflective with respect to the light emitted from the light emitting device 10.

The light emitted in the lateral direction from the light emitting device 10 is incident on the light incident surface 201a of the light guide plate 201. The light entering the light guide plate 201 from the light incident surface 201a spreads in the surface direction of the light guide plate 201 and is incident on the liquid crystal panel 202. The light emitted from the light guide plate 201 on the side opposite to the liquid crystal panel 202 is guided into the liquid crystal panel 202 by being reflected by the reflector 153.

FIG. 30A is a schematic view of a backlight using a light emitting module of a comparative example as the light source.

The light emitting device 300 of the light emitting module of this comparative example is a so-called top-view type. In other words, the light is emitted upward from the mounting surface of the mounting substrate 100. Accordingly, the mounting substrate 100 is supported by a frame 152 provided to oppose the light incident surface 201a to cause the light emitting surface of the light emitting device 300 to oppose the light incident surface 201a of the light guide plate 201.

Therefore, the mounting substrate 100 having the rectangular plate configuration is disposed upright with an orientation in which the mounting surface faces the light incident surface 201a; and this may lead to an increase of not only the thickness of the light guide plate 201 but also the thickness of the entire backlight unit.

Conversely, in the embodiment illustrated in FIG. 30B, not only the light guide plate 201 but also the entire backlight unit can be thinner because it is unnecessary for the mounting substrate 100 to be upright to face the light incident surface 201a of the light guide plate 201.

The red phosphor layer, the yellow phosphor layer, the green phosphor layer, and the blue phosphor layer described below can be used as the phosphor layer described above.

The red phosphor layer can contain, for example, a nitride-based phosphor of $CaAlSiN_3:Eu$ or a SiAlON-based phosphor.

In the case where a SiAlON-based phosphor is used, $$(M_{1-x}, R_x)_{a1}AlSi_{b1}O_{c1}N_{d1} \quad \text{Compositional Formula (1)}$$

can be used (where M is at least one type of metal element excluding Si and Al, and it is notable for M to be at least one selected from Ca and Sr; R is a light emission center element, and it is notable for R to be Eu; and x, a1, b1, c1, and d1 satisfy the following relationships: x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7).

By using the SiAlON-based phosphor of Compositional Formula (1), the temperature characteristics of the wavelength conversion efficiency can be improved; and the efficiency in the high current density region can be increased further.

The yellow phosphor layer can contain, for example, a silicate-based phosphor of $(Sr, Ca, Ba)_2SiO_4:Eu$.

The green phosphor layer can contain, for example, a halophosphate-based phosphor of $(Ba, Ca, Mg)_{10}(PO_4)_6Cl_2:Eu$ or a SiAlON-based phosphor.

In the case where a SiAlON-based phosphor is used, $$(M_{1-x}, R_x)_{a2}AlSi_{b2}O_{c2}N_{d2} \quad \text{Compositional Formula (2)}$$

can be used (where M is at least one type of metal element excluding Si and Al, and it is notable for M to be at least one selected from Ca and Sr; R is a light emission center element, and it is notable for R to be Eu; and x, a2, b2, c2, and d2 satisfy the following relationships: x is larger than 0 and 1 or less, a2 is larger than 0.93 and less than 1.3, b2 is larger than 4.0 and less than 5.8, c2 is larger than 0.6 and less than 1, and d2 is larger than 6 and less than 11).

By using the SiAlON-based phosphor of Compositional Formula (2), the temperature characteristics of the wavelength conversion efficiency can be improved; and the efficiency in the high current density region can be increased further.

The blue phosphor layer can contain, for example, an oxide-based phosphor of $BaMgAl_{10}O_{17}:Eu$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device, comprising:
a semiconductor layer including a first surface, a second surface opposite to the first surface, and a light emitting layer provided between the first surface and the second surface;
a p-side electrode provided on the semiconductor layer;
an n-side electrode provided on the semiconductor layer;
a first insulating layer provided on the second surface side, the first insulating layer having a first via communicating with the p-side electrode and a second via communicating with the n-side electrode;
a p-side interconnect layer including a first p-side interconnect layer electrically connected to the p-side electrode through the first via, and a second p-side interconnect layer electrically connected to the first p-side interconnect layer and provided on an interconnect surface provided on a side of the first insulating layer opposite to the semiconductor layer, the second p-side interconnect layer including a portion having a U-shaped cross section;
an n-side interconnect layer including a first n-side interconnect layer electrically connected to the n-side electrode through the second via, and a second n-side interconnect layer electrically connected to the first n-side interconnect layer, separated from the p-side interconnect layer and provided on the interconnect surface, the second n-side interconnect layer including a portion having a U-shaped cross section; and
a second insulating layer provided between the p-side interconnect layer and the n-side interconnect layer,
the portion of the second p-side interconnect layer having a p-side external terminal exposed from the first insulating layer and the second insulating layer at a third surface having a plane orientation different from the first surface and the second surface, the portion of the second n-side interconnect layer having an n-side external terminal exposed from the first insulating layer and the second insulating layer at the third surface.

2. The device of claim 1, further comprising a third insulating layer provided inside the U-shaped configuration of the second p-side interconnect layer and inside the U-shaped configuration of the second n-side interconnect layer.

3. The device of claim 2, wherein the second insulating layer and the third insulating layer are the same resin material.

4. The device of claim 1, wherein a distance between the p-side external terminal and the n-side external terminal exposed at the third surface is greater than a distance between the first p-side interconnect layer and the first n-side interconnect layer on the interconnect surface.

5. The device of claim 1, wherein a planar size of the first p-side interconnect layer is larger than a planar size of a portion of the second p-side interconnect layer provided on the first p-side interconnect layer.

6. The device of claim 1, wherein the first p-side interconnect layer is connected to the p-side electrode through a plurality of the first vias.

7. The device of claim 1, further comprising a transparent body provided on the first surface, the transparent body being transparent to an emitted light from the light emitting layer.

8. The device of claim 7, wherein the transparent body includes a transparent resin and a phosphor dispersed in the transparent resin.

9. The device of claim 7, further comprising a reflective film provided on a side surface of the transparent body, the reflective film being reflective with respect to the emitted light from the light emitting layer.

10. The device of claim 9, wherein the reflective film is provided also on a side surface of the first insulating layer.

11. The device of claim 1, wherein the third surface is perpendicular to the first surface.

12. The device of claim 1, wherein the third surface is not perpendicular to the first surface and is tilted with respect to the first surface.

13. The device of claim 1, wherein
  a planar configuration of the light emitting device is a rectangular configuration as viewed from a direction perpendicular to the first surface, and
  the third surface is a surface including a long side of the rectangular configuration.

14. A light emitting module, comprising:
  a mounting substrate including a pad in a mounting surface; and
  the device of claim 1 mounted to the mounting surface by bonding the p-side external terminal and the n-side external terminal to the pad,
  the first surface of the light emitting device being configured to face a lateral direction when the third surface faces downward.

15. A method for manufacturing a light emitting device, comprising:
  forming a p-side interconnect layer on an interconnect surface of a stacked body, the stacked body including a plurality of semiconductor layers, a p-side electrode, an n-side electrode, and a first insulating layer, the plurality of semiconductor layers being partitionally separated by a dicing region, each of the plurality of semiconductor layers including a first surface, a second surface opposite to the first surface, and a light emitting layer provided between the first surface and the second surface, the p-side electrode being provided on the semiconductor layer, the n-side electrode being provided on the semiconductor layer, the first insulating layer being provided on the second surface side and having a first via communicating with the p-side electrode, a second via communicating with the n-side electrode, and an interconnect surface formed on a side opposite to the semiconductor layer;
  forming an n-side interconnect layer on the interconnect surface apart from the p-side interconnect layer;
  forming a second insulating layer between the p-side interconnect layer and the n-side interconnect layer; and
  exposing a portion of the p-side interconnect layer and a portion of the n-side interconnect layer at a third surface of a plane orientation different from the first surface and the second surface by cutting a region of the dicing region, the cut region of the dicing region including the second insulating layer, a portion of the p-side interconnect layer, and a portion of the n-side interconnect layer,
  the forming of the p-side interconnect layer including:
    forming a first p-side interconnect layer inside the first via and on the interconnect surface; and
    forming a second p-side interconnect layer in a recessed configuration on the first p-side interconnect layer, a portion of the second p-side interconnect layer having a U-shaped cross section, and exposed from the first insulating layer and the second insulating layer,
  the forming of the n-side interconnect layer including:
    forming a first n-side interconnect layer inside the second via and on the interconnect surface; and
    forming a second n-side interconnect layer in a recessed configuration on the first n-side interconnect layer, a portion of the second n-side interconnect layer having a U-shaped cross section, and exposed from the first insulating layer and the second insulating layer.

16. The method of claim 15, further comprising filling a third insulating layer inside the second p-side interconnect layer and inside the second n-side interconnect layer.

17. The method of claim 15, wherein a portion of the p-side interconnect layer and a portion of the n-side interconnect layer are formed to jut onto the dicing region extending in a direction along the third surface.

18. The method of claim 17, wherein the jutting portions of the p-side interconnect layer and the n-side interconnect layer are formed on both width-direction sides of the dicing region extending in the direction along the third surface.

19. The method of claim 18, further comprising filling a third insulating layer inside the second p-side interconnect layer and inside the second n-side interconnect layer.

20. A light emitting device, comprising:
  a semiconductor layer including a first surface, a second surface opposite to the first surface, and a light emitting layer provided between the first surface and the second surface;
  a p-side electrode provided on the semiconductor layer;
  an n-side electrode provided on the semiconductor layer;
  a first insulating layer provided on the second surface side, the first insulating layer having a first via communicating with the p-side electrode and a second via communicating with the n-side electrode;
  a p-side interconnect layer including a first p-side interconnect layer electrically connected to the p-side electrode through the first via, and a second p-side interconnect layer electrically connected to the first p-side interconnect layer and provided on an interconnect surface provided on a side of the first insulating layer opposite to the semiconductor layer, the second p-side interconnect layer including a portion having an U-shaped cross section;

an n-side interconnect layer including a first n-side interconnect layer electrically connected to the n-side electrode through the second via, and a second n-side interconnect layer electrically connected to the first n-side interconnect layer, separated from the p-side interconnect layer and provided on the interconnect surface, the second n-side interconnect layer including a portion having an U-shaped cross section; and a second insulating layer provided between the p-side interconnect layer and the n-side interconnect layer.

* * * * *